US012616019B2

(12) United States Patent
Xie et al.

(10) Patent No.: US 12,616,019 B2
(45) Date of Patent: Apr. 28, 2026

(54) VIA CONNECTION TO BACKSIDE POWER DELIVERY NETWORK

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Somnath Ghosh, Clifton Park, NY (US); Julien Frougier, Albany, NY (US); Stuart Sieg, Albany, NY (US); Kevin Shawn Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 733 days.

(21) Appl. No.: 17/806,280

(22) Filed: Jun. 10, 2022

(65) Prior Publication Data

US 2023/0402318 A1     Dec. 14, 2023

(51) Int. Cl.
*H10W 20/41* (2026.01)
*H10W 20/00* (2026.01)
*H10W 20/42* (2026.01)

(52) U.S. Cl.
CPC ....... *H10W 20/427* (2026.01); *H10W 20/074* (2026.01); *H10W 20/082* (2026.01); *H10W 20/089* (2026.01); *H10W 20/42* (2026.01); *H10W 20/435* (2026.01)

(58) Field of Classification Search
CPC ........... H01L 23/5286; H01L 21/76804; H01L 21/76816; H01L 21/76829; H01L 23/5226; H01L 23/5283
See application file for complete search history.

(56) References Cited

U.S. PATENT DOCUMENTS

| | | | |
|---|---|---|---|
| 7,002,187 | B1 | 2/2006 | Husher |
| 9,570,395 | B1 | 2/2017 | Sengupta |
| 10,636,739 | B2 | 4/2020 | Beyne |
| 10,700,207 | B2 | 6/2020 | Chen |
| 11,121,256 | B2 | 9/2021 | Chen |
| 11,133,254 | B2 | 9/2021 | Lai |
| 2019/0386011 | A1 | 12/2019 | Weckx |
| 2020/0134128 | A1 | 4/2020 | Peng |
| 2020/0135578 | A1 | 4/2020 | Ching |
| 2020/0135634 | A1 | 4/2020 | Chiang |

(Continued)

FOREIGN PATENT DOCUMENTS

| | | |
|---|---|---|
| EP | 3454366 A1 | 3/2019 |
| EP | 3742487 A1 | 11/2020 |

OTHER PUBLICATIONS

Gupta et al., "Buried Power Rail Integration with Si FinFETs for CMOS Scaling beyond the 5 nm Node", 2020 Symposium on VLSI Technology Digest of Technical Papers—THL.6, 2020 IEEE, pp. 2.

(Continued)

*Primary Examiner* — Peter M Albrecht
(74) *Attorney, Agent, or Firm* — L. Jeffrey Kelly

(57) ABSTRACT

A semiconductor structure including a middle-of-line contact, a backside power rail, and a contact via extending between the middle-of-line contact and the backside power rail, wherein the contact via comprises a first portion having a negative tapered profile and a second portion having a positive tapered profile.

17 Claims, 24 Drawing Sheets

(56) References Cited

U.S. PATENT DOCUMENTS

2020/0266169 A1      8/2020  Kang
2021/0343578 A1*  11/2021  Chang ................. H01L 21/7682
2021/0351303 A1    11/2021  Ju
2021/0358891 A1    11/2021  Chuang
2023/0352408 A1*  11/2023  Jung ................... H01L 23/5286

OTHER PUBLICATIONS

Gupta et al., "Buried Power Rail Scaling and Metal Assessment for the 3 nm Node and Beyond", 2020 IEEE International Electron Devices Meeting (IEDM), Dec. 18, 2020, pp. 5.

Mallik et al., "Economics of semiconductor scaling—a cost analysis for advanced technology node", 2019 Symposium on VLSI Technology Digest of Technical Papers, 2019, pp. 1-2.

Mathur et al., "Buried Bitline for sub-5nm SRAM Design", 2020 IEEE International Electron Devices Meeting (IEDM), 2020, pp. 5.

Moroz et al., "Can We Ever Get to a 100 nm Tall Library? Power Rail Design for 1nm Technology Node", 2020 IEEE, pp. 1-2.

Prasad et al., "Buried Power Rails and Back-side Power Grids: Arm® CPU Power Delivery Network Design Beyond 5nm", 2019 IEEE, pp. 446-449.

* cited by examiner

SECTION Y-Y

SECTION Y-Y

SECTION Y-Y

SECTION Y-Y

*SECTION Y-Y*

SECTION Y-Y

SECTION Y-Y

SECTION Y-Y

*SECTION Y-Y*

SECTION Y-Y

SECTION Y-Y

SECTION Y-Y

SECTION Y-Y

SECTION Y-Y

SECTION X-X

SECTION Y-Y

SECTION X-X

SECTION Y-Y

SECTION X-X

SECTION Y-Y

SECTION X-X

SECTION Y-Y

SECTION X-X

SECTION Y-Y

SECTION X-X

SECTION Y-Y

SECTION X-X

SECTION Y-Y

SECTION X-X

SECTION Y-Y

SECTION X-X

SECTION Y-Y

SECTION X-X

SECTION Y-Y

VIA CONNECTION TO BACKSIDE POWER DELIVERY NETWORK

BACKGROUND

The present invention generally relates to semiconductor structures, and more particularly to via connections to backside power delivery networks.

Power delivery distribution networks for conventional 3D monolithic designs typically have parallel power busses (e.g., VDD and ground) that are formed as part of a metallization level of a back-end-of-line (BEOL) interconnect network. Vertical interconnects are used to route ground and VDD connections from the upper power busses in the BEOL to the underlying devices.

Such conventional power distribution network solutions for 3D monolithic IC designs present unique challenges. For example, conventional power distribution networks occupy a significant amount of area in each IC layout, thereby limiting integration density.

SUMMARY

According to an embodiment of the present invention, a semiconductor structure is provided. The semiconductor structure may include a middle-of-line contact, a backside power rail, and a contact via extending between the middle-of-line contact and the backside power rail, wherein the contact via comprises a first portion having a negative tapered profile and a second portion having a positive tapered profile.

According to another embodiment of the present invention, a semiconductor structure is provided. The semiconductor structure may include a middle-of-line contact, a backside power rail, and a contact via extending between the middle-of-line contact and the backside power rail, wherein an upper portion of the contact via comprises a positive tapered profile, and wherein a lower portion of the contact via comprises a negative tapered profile.

According to another embodiment of the present invention, a semiconductor structure is provided. The semiconductor structure may include a middle-of-line contact, a backside power rail, and a contact via extending between the middle-of-line contact and the backside power rail, wherein an upper portion of the contact via comprises a negative tapered profile, and wherein a lower portion of the contact via comprises a positive tapered profile.

BRIEF DESCRIPTION OF THE DRAWINGS

The following detailed description, given by way of example and not intended to limit the invention solely thereto, will best be appreciated in conjunction with the accompanying drawings, in which.

Figure 1:
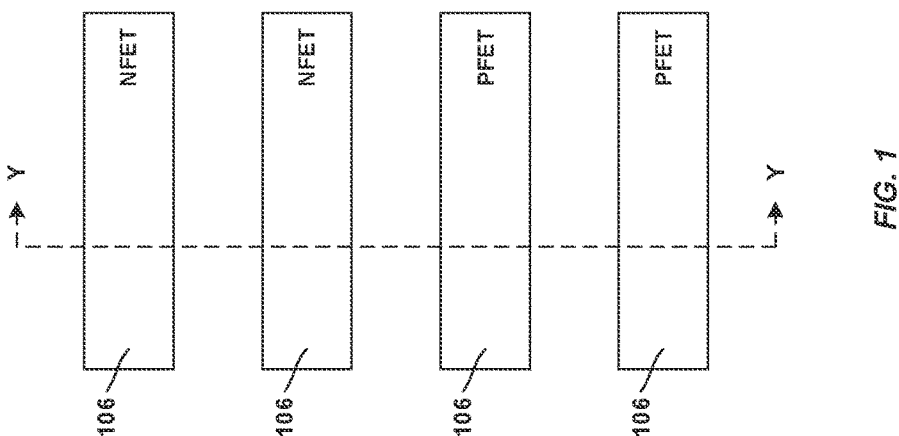
FIGS. 1 and 2 depict views of a semiconductor structure during an intermediate step of a method of fabricating a transistor structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Forming power delivery networks on a backside of a wafer have known advantages; however, forming electrical connections, for example VBPR contacts, to the backside power delivery network from the frontside of the wafer continues to present challenges as cell spacing decreases with device scaling. Specifically, the electrical connections must be very narrow to fit between adjacent cells and avoid unwanted shorting. Such narrow connections have increased resistance and thereby retrain device performance.

The present invention generally relates to semiconductor structures, and more particularly to via connections to backside power delivery networks. More specifically, the structures and associated methods disclosed herein enable a novel solution for providing unique via connections to backside power delivery networks formed during both frontside processing and backside processing. Exemplary embodiments of the unique via connections to backside power delivery networks are described in detail below by referring to the accompanying drawings in FIGS. 1 to 55. Those skilled in the art will readily appreciate that the detailed description given herein with respect to these figures is for explanatory purposes as the invention extends beyond these limited embodiments.

Referring now to FIGS. 1-21, a semiconductor structure represented by structure 100 is shown during an intermediate step of a method of fabricating a stacked transistor structure according to an embodiment of the invention.

Figure 2:
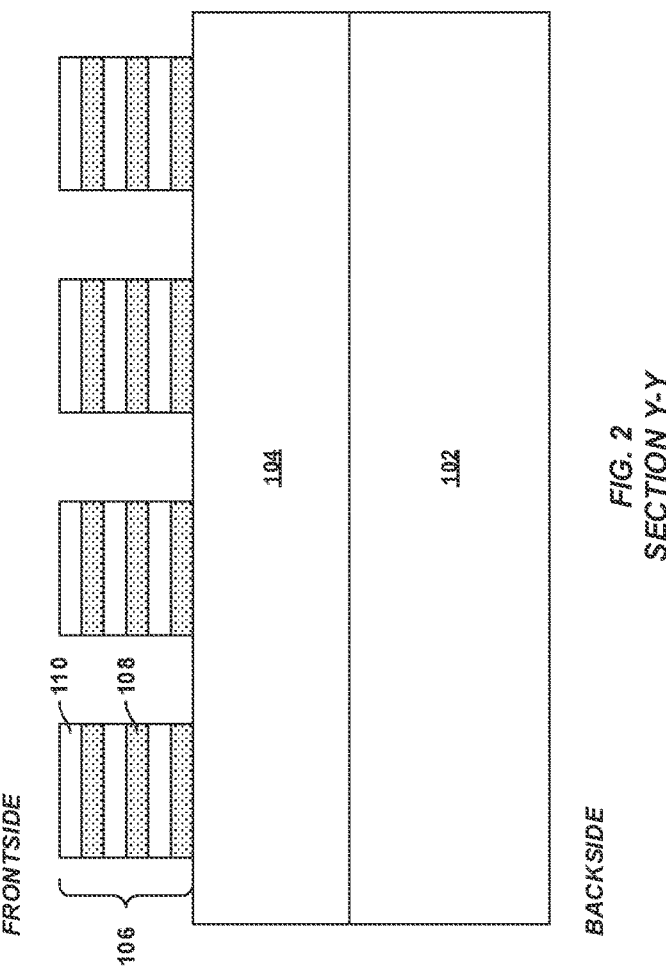

Referring now to FIGS. 1 and 2, the structure 100 is shown after providing a substrate 102, a buried dielectric layer 104, and forming nanosheet stacks 106 on the buried dielectric layer 104 according to an embodiment of the invention. FIG. 1 is a representative illustration of a top view of the structure 100 omitting some materials and layers, for example, patterning layers, masking layers and interlevel dielectrics. As such, only pertinent conductive layers and components are shown in the top views to provide a clear understanding of their relative orientation. FIG. 2 depicts a cross-sectional view of the structure 100 shown in FIG. 1 taken along line Y-Y. It is noted, FIGS. 1-12 and their corresponding descriptions are directed at frontside processing, while FIGS. 13-22 and their corresponding descriptions are directed at backside processing.

The substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. In practice, a conventional silicon substrate may suffice because the substrate will be subsequently removed, as described below. In the present case, the substrate 102 may be about, but is not limited to, several hundred microns thick, or at least thick enough to provide sufficient structural support for subsequent fabrication.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material. Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm.

The nanosheet stacks 106 are formed from an alternating series of sacrificial nanosheets 108 and channel nanosheets 110 deposited on a frontside of the structure 100. For example, the sacrificial nanosheets 108 may be silicon germanium (SiGe) while the channel nanosheets 110 may be silicon (Si). The nanosheet stacks 106 are formed directly on the buried dielectric layer 104. Although only six alternating nanosheets (108, 110) are shown, one or more additional sacrificial nanosheets and/or channel nanosheets can optionally be epitaxially grown in an alternating fashion, and the properties of any additional nanosheets are the same as the corresponding nanosheets described herein.

Figure 3:
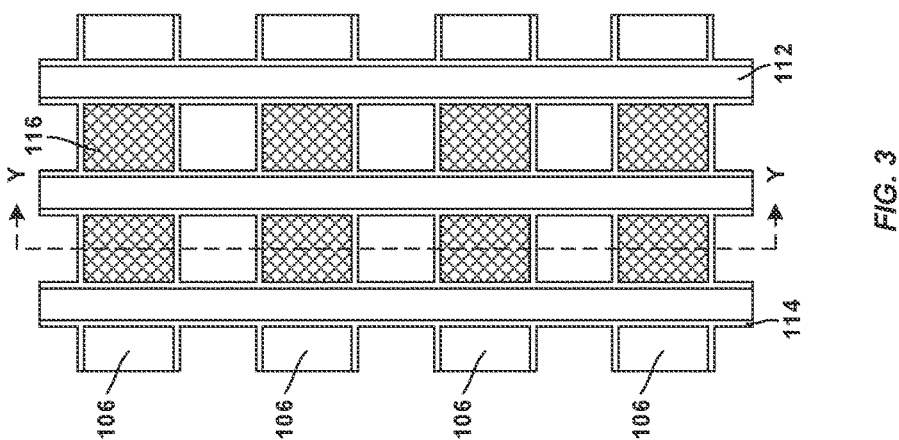
FIGS. 3 and 4 depict views of a semiconductor structure after forming metal gate lines, gate spacers, inner spacers (not shown), and source drain epitaxy according to an exemplary embodiment.
Figure 4:
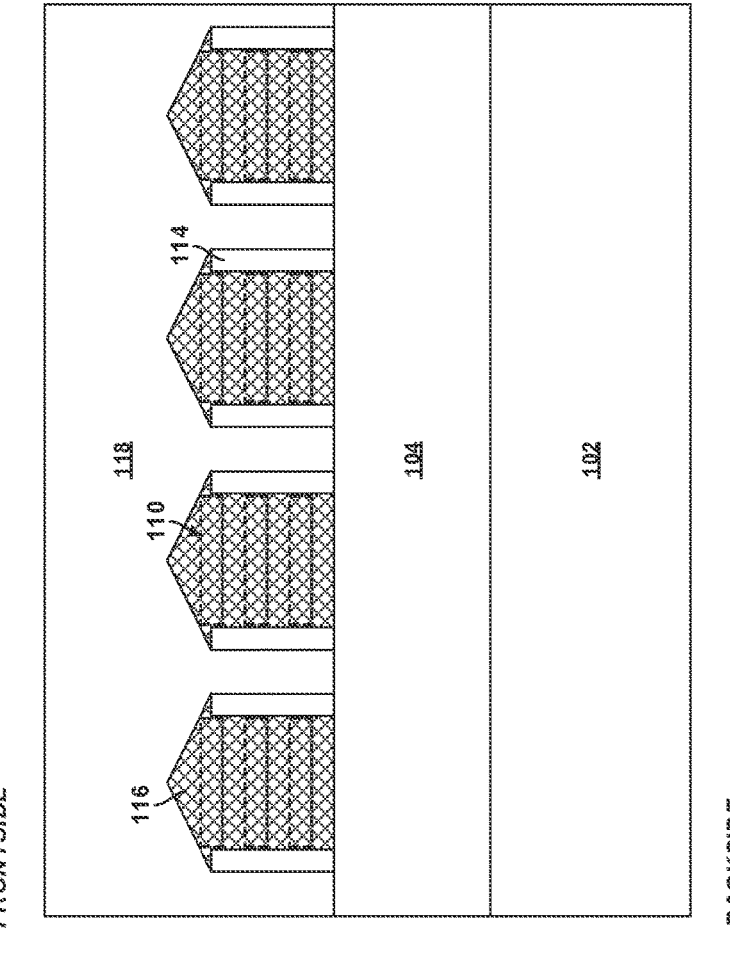
Figure 4:

Referring now to FIGS. 3 and 4, the structure 100 is shown after forming high-k metal gate lines 112, gate spacers 114, inner spacers (not shown), and source drain epitaxy 116 according to an embodiment of the invention. FIG. 3 is a representative illustration of a top view of the structure 100 omitting some features as described above with reference to FIG. 1. FIG. 4 depicts a cross-sectional view of the structure 100 shown in FIG. 3 taken along line Y-Y.

According to known techniques, the high-k metal gates lines 112, the gate spacers 114, the inner spacers, and the source drain epitaxy 116 are formed using conventional nanosheet and replacement metal gate techniques. For example, dummy gate lines are first patterned perpendicular to the nanosheet stacks 106. Next, the gate spacers 114 are disposed on opposite and exposed sidewalls of each the dummy gate lines and the nanosheet stacks 106 in a typical fashion. Additionally, the sacrificial nanosheets 108 are laterally recessed beneath the dummy gate lines and inner spacers are formed according to known techniques. The inner spacers will separate the high-k metal gate lines 112 from the source drain epitaxy 116. Next, the source drain epitaxy 116 is grown on exposed surfaces of the channel nanosheets 110 between the dummy gate lines. Next, a dielectric layer 118, such as, a known interlevel dielectric material, is blanket deposited and polished flat. Finally, the dummy gate lines are removed, portions of the sacrificial nanosheets 108 beneath the dummy gate lines are removed selective to the channel nanosheets 110, and the high-k metal gate lines 112, otherwise known as replacement metal gates, are formed using known processes and techniques. Finally, gate cut regions (not shown) of may be added to further isolate adjacent cells according to known techniques.

Figure 5:
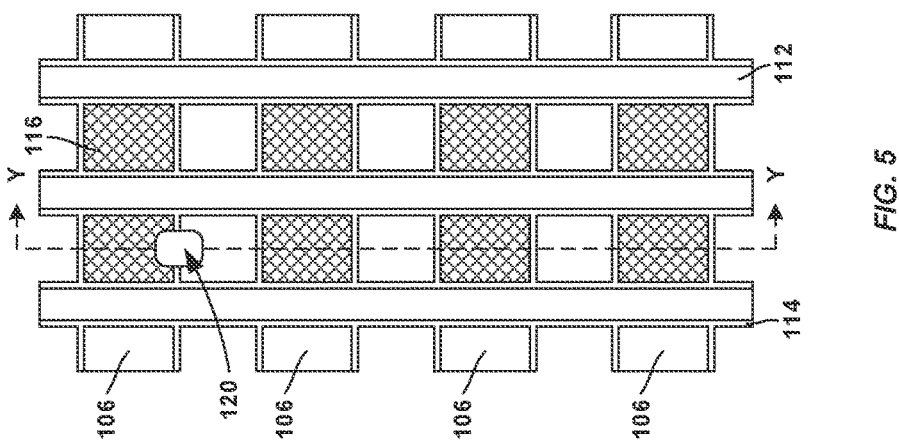
FIGS. 5 and 6 depict views of a semiconductor structure after forming a backside power rail contact via trench (hereinafter "VBPR trench") according to an exemplary embodiment.
Figure 6:
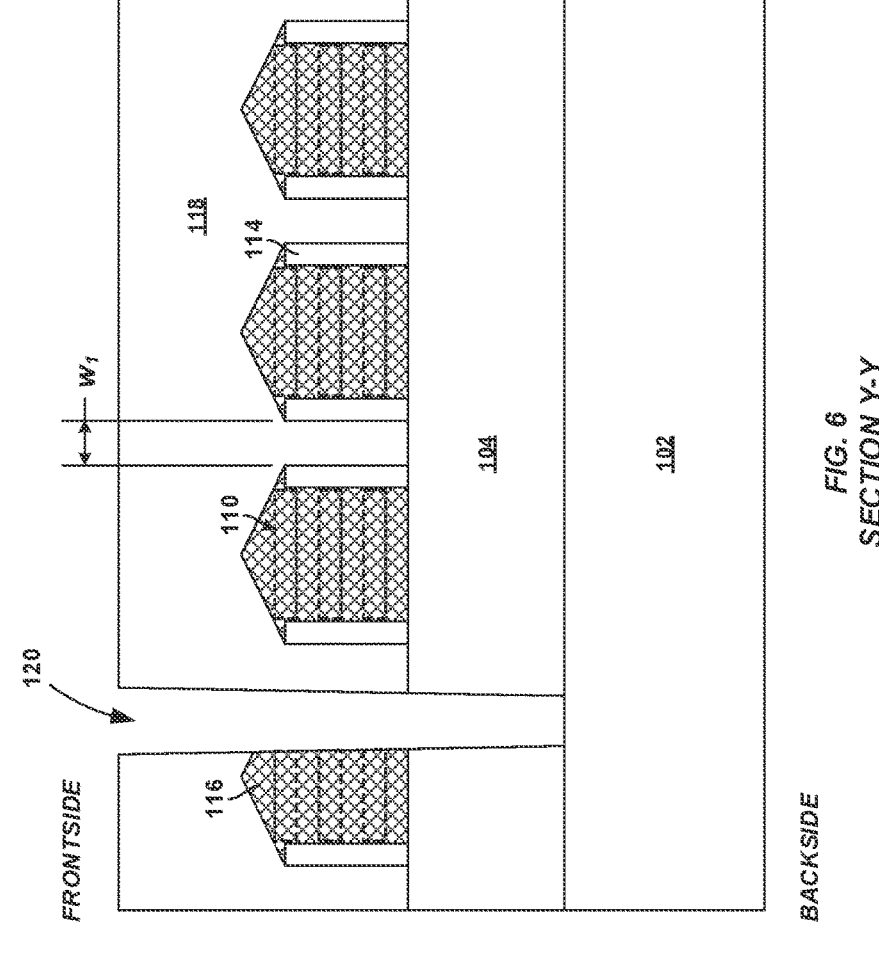

Referring now to FIGS. 5 and 6, the structure 100 is shown after forming a backside power rail contact via trench 120 (hereinafter "VBPR trench 120") according to an embodiment of the invention. FIG. 5 is a representative illustration of a top view of the structure 100 omitting some features as described above with reference to FIG. 1. FIG. 6 depicts a cross-sectional view of the structure 100 shown in FIG. 5 taken along line Y-Y.

The VBPR trench 120 is formed using known patterning and etching techniques. Specifically, a mask (not shown) is first deposited and patterned to expose a portion of the dielectric layer 118 generally located in a source drain region and intersecting or overlapping one of the source drain epitaxy 116 between two high-k metal gates lines 112, as illustrated. Next, known high aspect ratio etching techniques are used to remove portions of the dielectric layer 118, the source drain epitaxy 116, and the buried dielectric layer 104 selective to the mask until the substrate 102 is exposed at a bottom of the VBPR trench 120. In all cases, the VBPR trench 120 must be carefully positioned to overlap only one source drawing epitaxy 116. Said differently, the VBPR trench 120 must not expose, or overlap two adjacent source drain epitaxy 116 or else adjacent cells will short to one another.

In at least an embodiment, a directional dry etching technique, such as reactive ion etching, is used to etch or remove portions of the dielectric layer 118, the source drain epitaxy 116, and the buried dielectric layer 104 selective to the mask. In some cases, forming the VBPR trench 120 may also etch or remove portions of the channel nanosheets 110, as illustrated.

It is noted, the spacing ($w_1$) between adjacent cells is very small, for example, equal to or less than about 40 nm. As such, the VBPR trench 120 must be even narrower to prevent shorting between adjacent cells. For example, because the spacing between adjacent cells, measured in the y-direction, is very tight, the aspect ratio of the VBPR trench 120 must be equal to or greater than about 5:1. Stated differently, the VBPR trench 120 will need to be at least 5 times deeper than its width in order to (a) fit between adjacent cells, and (b) fully extend through the various layers and expose the underlying substrate 102.

Figure 7:
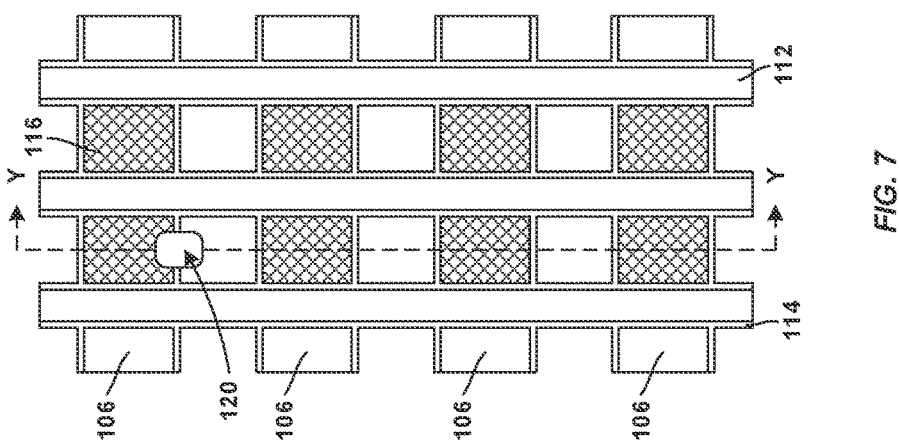
FIGS. 7 and 8 depict views of a semiconductor structure after filling the VBPR trench with a sacrificial material and subsequently recessing the sacrificial material according to an exemplary embodiment.
Figure 8:
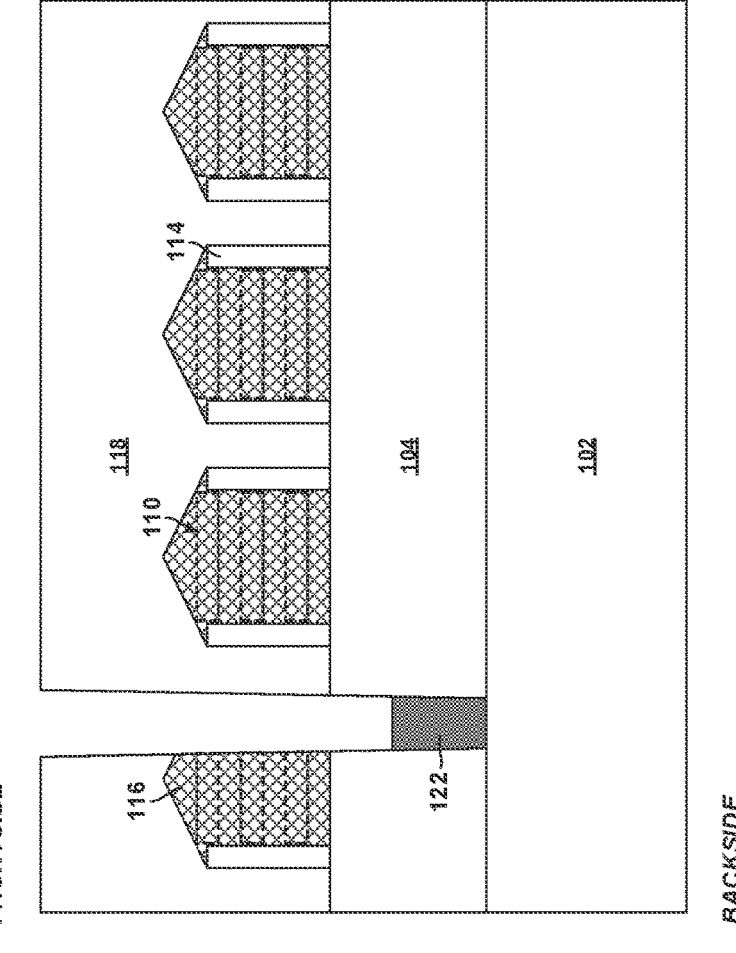

Referring now to FIGS. 7 and 8, the structure 100 is shown after filling the VBPR trench 120 with a sacrificial material 122 and subsequently recessing the sacrificial material 122 according to an embodiment of the invention. FIG. 7 is a representative illustration of a top view of the structure 100 omitting some features as described above with reference to FIG. 1. FIG. 8 depicts a cross-sectional view of the structure 100 shown in FIG. 7 taken along line Y-Y.

First, the sacrificial material 122 is deposited in the VBPR trench 120 according to known techniques. Specifically, the sacrificial material 122 may be any innocuous material capable of being removed selective to the buried dialectic layer 104. For example, the sacrificial material 122 may include SiC, AlOx, AlNx, TiOx, SiCO or other known suitable materials. Next, the sacrificial material 122 is recessed as illustrated. Specifically, the sacrificial material 122 is recessed to a depth at or below the source drain epitaxy 116. For example, a target depth may be about the centerline of the buried dielectric layer 104. If the sacrificial material 122 is recessed to a level at or below about the centerline of the buried dielectric layer 104, advantages of the present invention might be diminished, as described below with reference to FIGS. 20 and 23. Alternatively, if the sacrificial material 122 is recessed to a level at or above the centerline of the buried dielectric layer 104, there is a risk subsequent processing techniques might damage the source drain epitaxy 116, as described below with reference to FIGS. 20 and 24.

The sacrificial material 122 can be any material that which may be subsequently removed selective to selective to both the buried dielectric layer 104 and the conductive material of a subsequently formed VBPR contact (see FIG. 18). For example, the sacrificial material 122 may be made from TiO, AlO, SiOC, AlN, or others.

Figure 9:
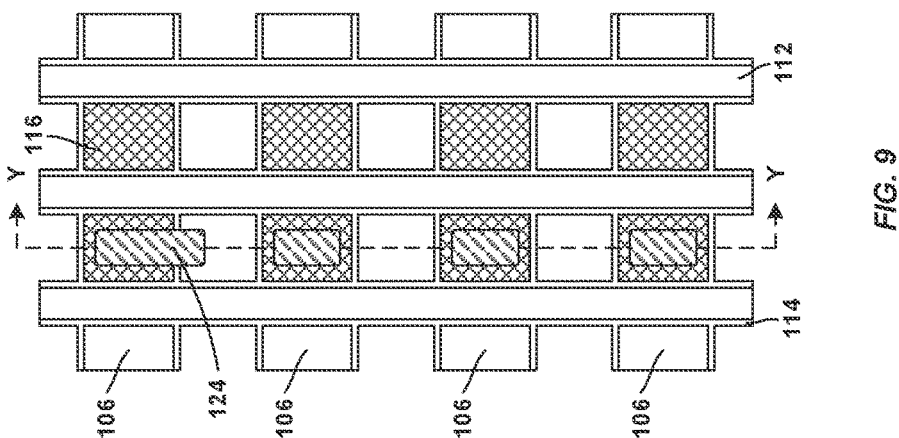
FIGS. 9 and 10 depict views of a semiconductor structure after forming middle-of-line contacts according to an exemplary embodiment.
Figure 10:
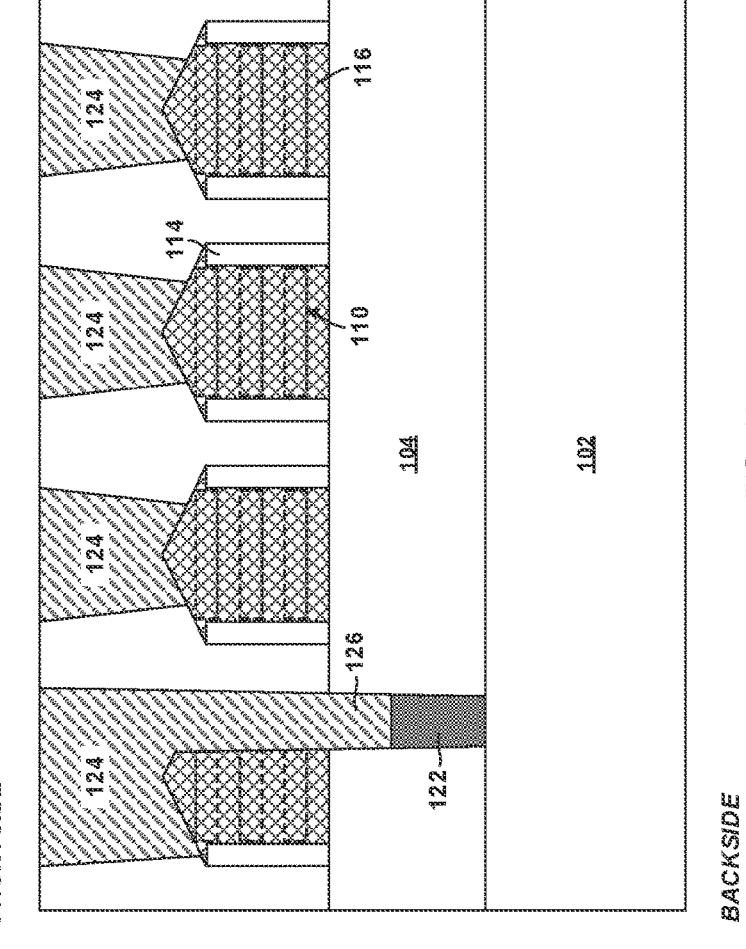

Referring now to FIGS. 9 and 10, the structure 100 is shown after forming middle-of-line contacts 124 according to an embodiment of the invention. FIG. 9 is a representative illustration of a top view of the structure 100 omitting some features as described above with reference to FIG. 1. FIG. 10 depicts a cross-sectional view of the structure 100 shown in FIG. 9 taken along line Y-Y.

The middle-of-line contacts 124 may include source drain contacts (as illustrated in FIG. 10) as well as gate contacts (not shown). According to embodiments of the present invention, forming the middle-of-line contacts 124 further includes forming a partial VBPR contact 126.

According to embodiments of the present invention the middle-of-line contacts 124 and the partial VBPR contact 126 are formed using typical patterning and damascene metallization techniques in which contact trenches are patterned in the dielectric layer 118 and then subsequently filled with a conductive material.

The middle-of-line contacts 124 and the partial VBPR contact 126 may include any suitable conductive material, such as, for example, ruthenium, tungsten, cobalt, or alloys thereof. In some embodiments, a metal silicide is formed at the bottom of the contact trenches, directly on the source drain epitaxy 116, prior to filling them with the conductive material. After filling, excess conductive material can be polished using known techniques until a topmost surface of the middle-of-line contacts 124 and the partial VBPR contact 126 are flush, or substantially flush, with topmost surfaces of the dielectric layer 118.

Figure 11:
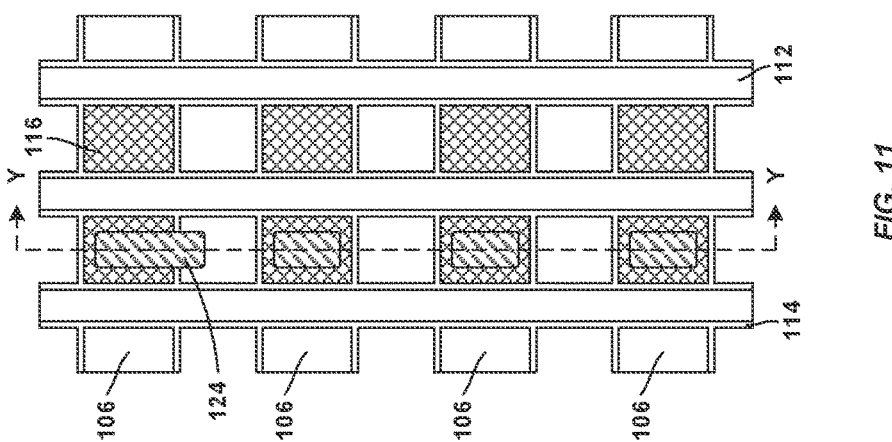
FIGS. 11 and 12 depict views of a semiconductor structure after forming back-end-of-line layers and securing a carrier wafer according to an exemplary embodiment.
Figure 12:
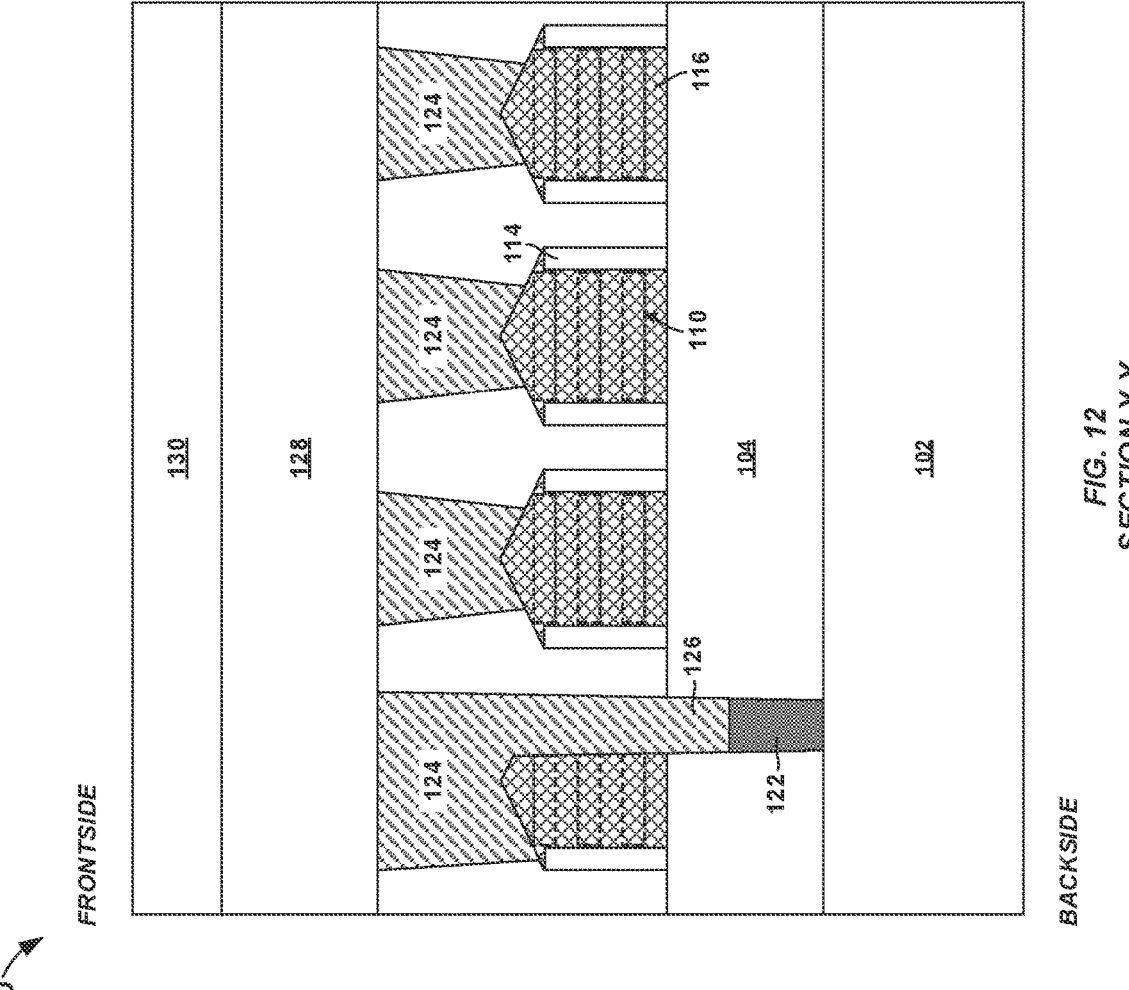

Referring now to FIGS. 11 and 12, the structure 100 is shown after forming back-end-of-line layers 128 and securing a carrier wafer 130 according to an embodiment of the invention. FIG. 11 is a representative illustration of a top view of the structure 100 omitting some features as described above with reference to FIG. 1. FIG. 12 depicts a cross-sectional view of the structure 100 shown in FIG. 11 taken along line Y-Y.

First, the back-end-of-line layers 128 are formed according to known techniques. Next the carrier wafer 130 is attached, or removably secured, to the back-end-of-line layers 128. In general, and not depicted, the carrier wafer 130 may be thicker than the other layers. Temporarily bonding the structure 100 to a thicker carrier provides improved handling and additional support for backside processing of thin wafers. After backside processing described below, the structure may be de-bonded, or removed, from the carrier wafer 130 according to known techniques.

Figure 13:
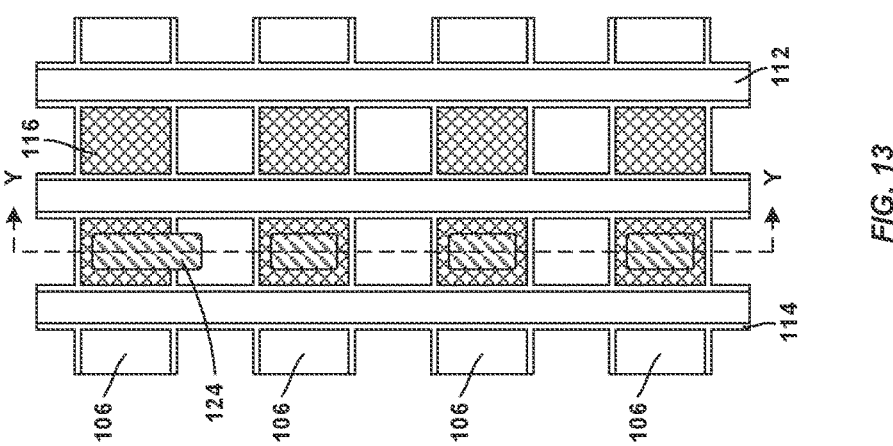
FIGS. 13 and 14 depict views of a semiconductor structure after flipping the assembly and removing the substrate according to an exemplary embodiment.
Figure 14:
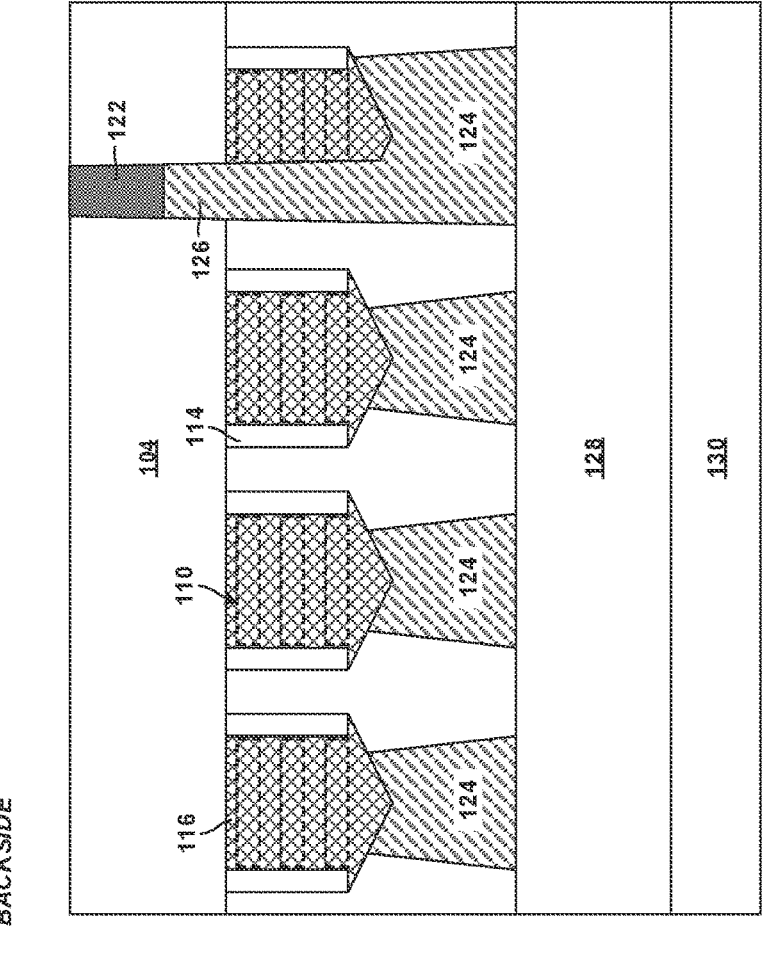

Referring now to FIGS. 13 and 14, the structure 100 is shown after flipping the assembly and removing the substrate 102 according to an embodiment of the invention. FIG. 13 is a representative illustration of a top view of the structure 100 omitting some features as described above with reference to FIG. 1. FIG. 14 depicts a cross-sectional view of the structure 100 shown in FIG. 13 taken along line Y-Y. It is noted, the top views referenced and illustrated hereafter will continue to reflect a "top down" view from the frontside of the structure 100, and are not flipped, rotated, or otherwise adjusted to reflect flipping of the structure 100.

First the structure 100 is flipped 180 degrees to prepare for backside processing. In general, backside processing includes fabrication or processing of the structure 100 opposite the active device and wiring layers. Next, the substrate 102 is removed selective to the buried dielectric layer 104 according to known techniques. Specifically, and most important to embodiments described herein, a topmost surface of the sacrificial material 122 is exposed after removing the substrate 102, as illustrated.

Figure 15:
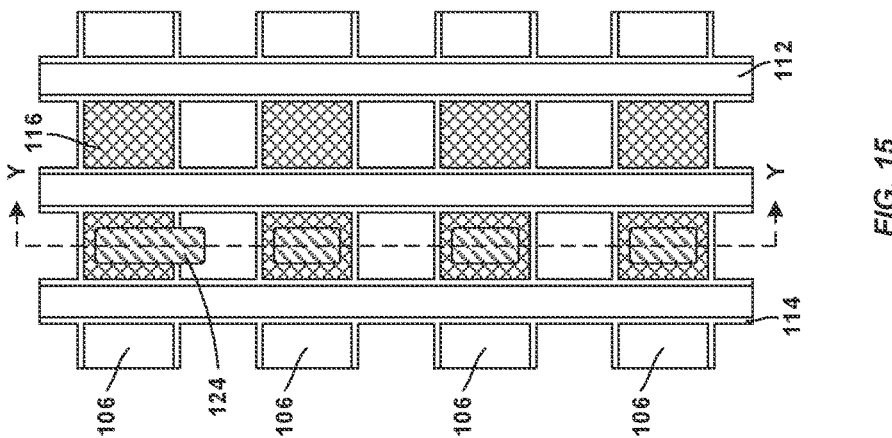
FIGS. 15 and 16 depict views of a semiconductor structure after forming an etch stop layer following by a backside power rail dielectric layer (hereinafter "backside dielectric layer") according to an exemplary embodiment.
Figure 16:
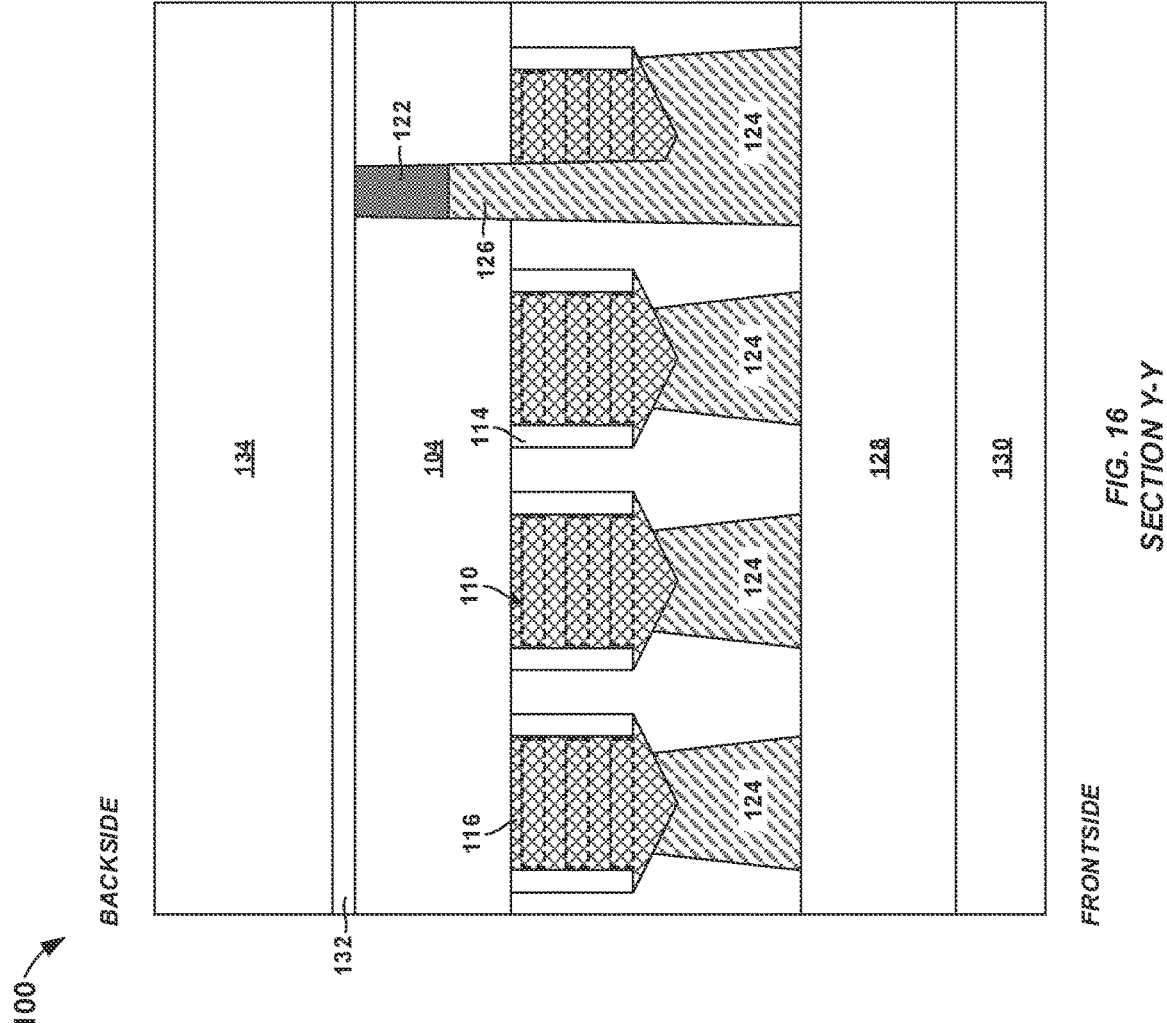

Referring now to FIGS. 15 and 16, the structure 100 is shown after forming an etch stop layer 132 following by a backside power rail dielectric layer 134 (hereinafter "backside dielectric layer 134") according to an embodiment of the invention. FIG. 13 is a representative illustration of a top view of the structure 100 omitting some features as described above with reference to FIG. 1. FIG. 14 depicts a cross-sectional view of the structure 100 shown in FIG. 15 taken along line Y-Y.

The etch stop layer 132 and the backside dielectric layer 134 are banket deposited, one after the other, across the backside of the structure 100 according to known techniques.

For purposes of the embodiment described herein, the etch stop layer 132 may be any material suitable for providing adequate etch selectivity with the backside dielectric layer 134. Stated differently, the materials chosen for the etch stop layer 132 and the backside dielectric layer 134 should allow for etching portions of the backside dielectric layer 134 selective to the etch stop layer 132, as discussed below. In an embodiment, for example, the etch stop layer 132 is made from silicon nitride and the backside dielectric layer 134 is made from silicon oxide. In another example, the etch stop layer 132 can be high-k dielectric, for example, HfO2, and the backside dielectric layer 134 can be SiN.

In at least one embodiment, the backside dielectric layer 134 may include any low-k dielectric materials, such as, for example, silicon dioxide. The backside dielectric layer 134 may, in some embodiments, be made from identical dielectric materials as the buried oxide layer 104, the dielectric layer 118, or both. Alternatively, the backside dielectric layer 134 can be made different dielectric materials from the other dielectrics previously described above.

Figures 17, 18:
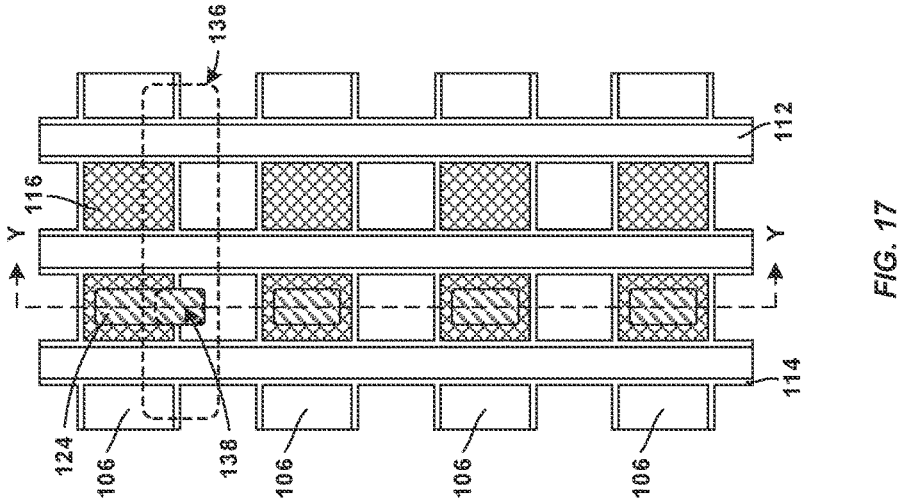
FIGS. 17 and 18 depict views of a semiconductor structure after forming backside power rail trenches (hereinafter "BPR trenches") and removing the sacrificial material to create a backside power rail contact via opening (hereinafter "VBPR opening) according to an exemplary embodiment.

Referring now to FIGS. 17 and 18, the structure 100 is shown after forming backside power rail trenches 136 (hereinafter "BPR trenches 136") and removing the sacrificial material 122 to create a backside power rail contact via opening 138 (hereinafter "VBPR opening 138") according to an embodiment of the invention. FIG. 17 is a representative illustration of a top view of the structure 100 omitting some features as described above with reference to FIG. 1. FIG. 18 depicts a cross-sectional view of the structure 100 shown in FIG. 17 taken along line Y-Y.

According to embodiments of the present invention the BPR trenches 136 are formed using typical patterning techniques. For example, a first technique is used to etch the backside dielectric layer 134 selective to the etch stop layer 132, followed by a second etching technique to remove exposed positions of the etch stop layer 132. In at least an embodiment, the BPR trench 136 may have a width, in the y-direction, ranging from about 40 nm to about 150 nm.

Once exposed portions of the etch stop layer 132 are removed, a surface of the sacrificial material 122 becomes exposed, and is then subsequently removed according to know techniques. For example, the sacrificial material 122 can be removed using wet etching techniques suitable to remove the sacrificial material 122 selective to both the buried dielectric layer 104 and the VBPR contact 126, as illustrated.

It is noted the VBPR opening 138 has tapered profile matching that of the partial VBPR contact 126. Additionally, the tapered profile of the VBPR opening 138 is opposite of the tapered profile of the BPR trenches 136 due to the fact each was fabricated from a different side of the structure 100.

Figure 19:
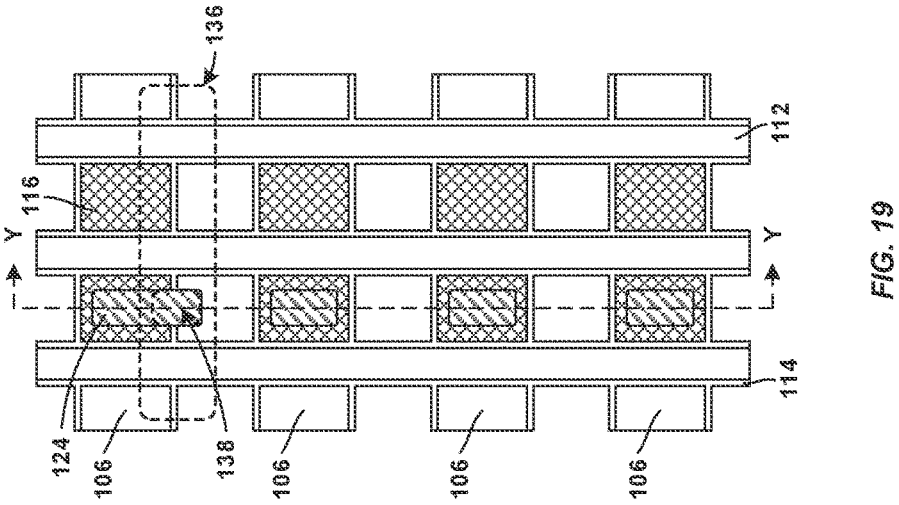
FIGS. 19 and 20 depict views of a semiconductor structure after enlarging the BPR trenches and the VBPR opening structure according to an exemplary embodiment.
Figure 20:
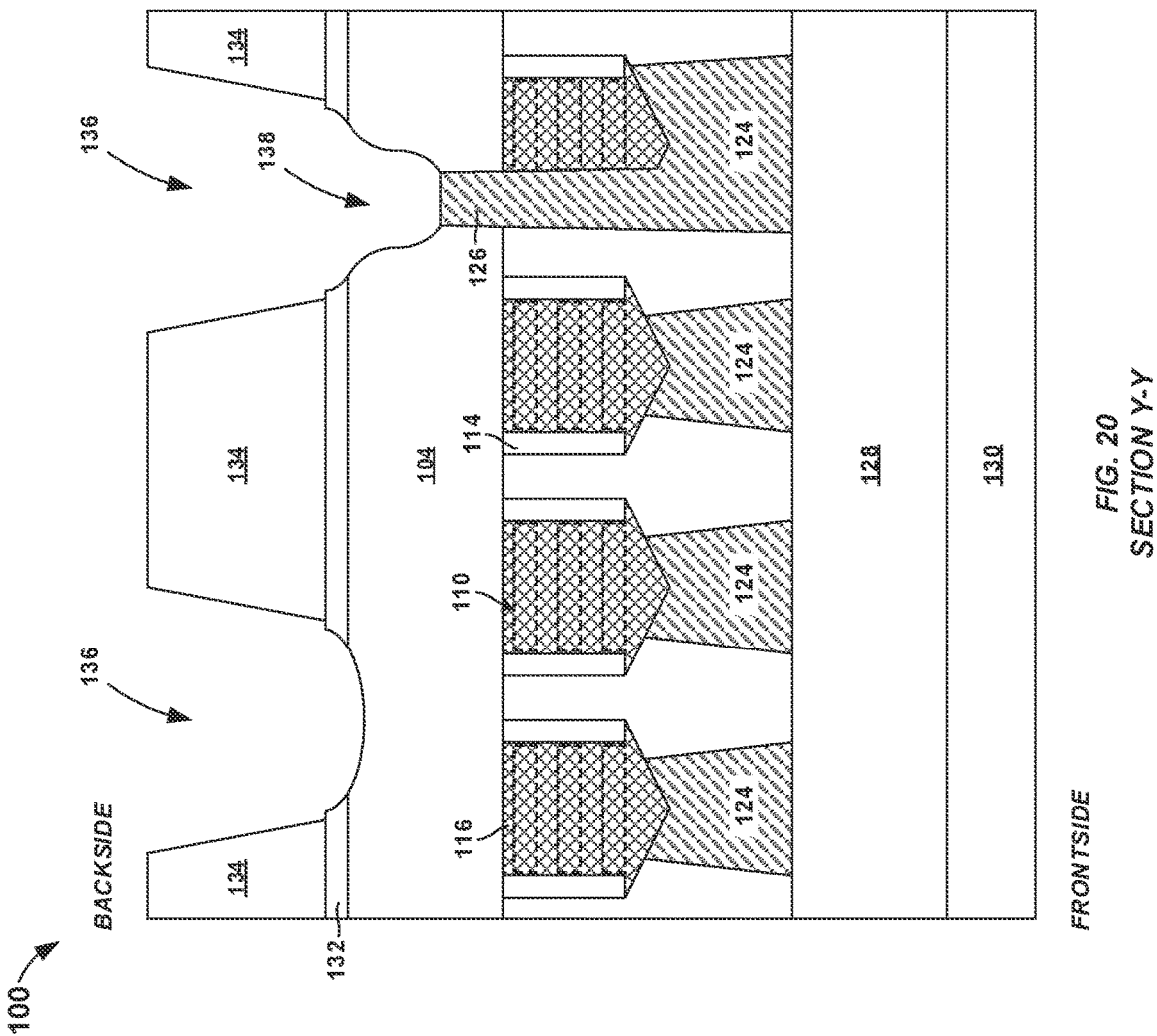

Referring now to FIGS. 19 and 20, the structure 100 is shown after enlarging the BPR trenches 136 and the VBPR opening 138 according to an embodiment of the invention. FIG. 17 is a representative illustration of a top view of the structure 100 omitting some features as described above with reference to FIG. 1. FIG. 18 depicts a cross-sectional view of the structure 100 shown in FIG. 17 taken along line Y-Y.

An additional etching technique is applied to enlarge or deepen the BPR trenches 136 and the VBPR opening 138, as illustrated. Specifically, a directional or isotropic dry etching technique, such as reactive ion etching, is used to etch exposed portions of the buried dielectric layer 104 and further expand or enlarge the BPR trenches 136 and the VBPR opening 138. The object of this additional etching technique is to increase the size, or width, of the VBPR opening 138 that was previously filled with the sacrificial material 122. As such, due to the nature of a directional etch, such as plasma, and the geometry of the BPR trenches 136 and the VBPR opening 138 the resulting profiles are particularly unique. Specifically, the BPR trenches 136 will get deeper and only marginally wider. For example, after the present etch, the BPR trenches 136 will be wider than the opening in the etch stop layer 134. Similarly, the VBPR opening 138 will get wider resulting in a new tapered profile because the etch process will quickly remove the corners at the top of the VBPR opening 138, as illustrated. It is noted, the new tapered profile of the VBPR opening 138 will be tapered in a direction similar to the BPR trenches 136 and opposite the VBPR contact trench 120.

The directional etching technique should be chosen specifically to remove material of the buried dielectric layer 104 selective to the partial VBPR contact 126 and the etch stop layer 132. As previously mentioned above, doing so will inherently also remove some of the backside dielectric layer 134.

As previously discussed, if the sacrificial material 122 is recessed to a level at or below a centerline of the buried dielectric layer 104, relative to FIG. 8, the VBPR opening 138 would be shallower than depicted in FIG. 18, and the partial VBPR contact 126 will extend into the buried dielectric layer 104 more than depicted in FIG. 18. As such, the directional etching described above would generally result in a smaller or narrower opening (see FIG. 23). Additionally, in yet another embodiment, the direction etching described above could be continued to expose both a top surface and sidewall surfaces of the partial VBPR contact 126, as described below with reference to FIG. 25.

Alternatively, also as previously discussed, if the sacrificial material 122 is recessed to a level at or above a centerline of the buried dielectric layer 104, relative to FIG. 8, the VBPR opening 138 would be deeper than depicted in FIG. 18, and the partial VBPR contact 126 would extend into the buried dielectric layer 104 less than depicted in FIG. 18. As such, the directional etching described above would generally result in a larger or wider opening (see FIG. 24). Additionally, there remains some risk of over etching and damaging the source drain epitaxy 116.

Figures 21, 22:
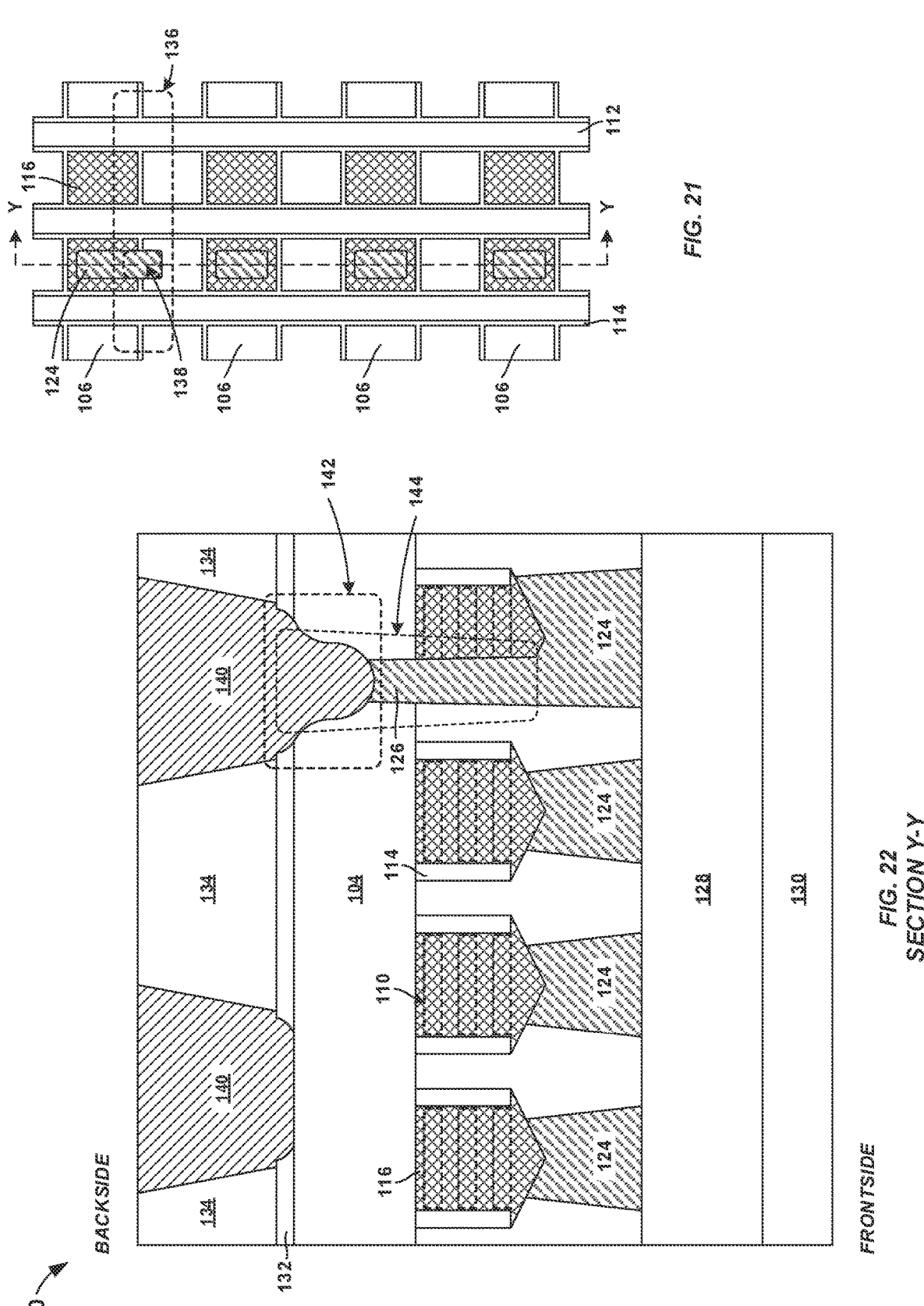
FIGS. 21 and 22 depict views of a semiconductor structure after forming backside power rails 140 and a VBPR extension according to an exemplary embodiment.

Referring now to FIGS. 21 and 22, the structure 100 is shown after forming backside power rails 140 and a VBPR extension 142 according to an embodiment of the invention. FIG. 21 is a representative illustration of a top view of the structure 100 omitting some features as described above with reference to FIG. 1. FIG. 20 depicts a cross-sectional view of the structure 100 shown in FIG. 21 taken along line Y-Y.

The backside power rails 140 and the VBPR extension 142 are formed by filling the BPR trenches 136 and the VBPR opening 138 with a conductive material according to known techniques. As such, according to an embodiment, the backside power rails 140 and the VBPR extension 142 are made from the same homogeneous material. In other cases, a first material may be deposited in the VBPR opening 138 and a second material may be deposited in the BPR trenches 136. Additionally, the backside power rails 140, the VBPR extension 142, the partial VBPR contact 126, and the middle-of-line-contacts 124 may be made from the same conductive materials or different conductive materials depending on desired device characteristics.

In an embodiment, the backside power rails 140 and the VBPR extension 142 may include any suitable conductive material, such as, for example, ruthenium, tungsten, cobalt, or alloys thereof. After filling, excess conductive material can be polished using known techniques until a topmost surface of the backside power rails 140 are flush, or substantially flush, with topmost surfaces of the backside dielectric layer 134.

According to embodiments of the present invention, a VBPR contact 144 includes both the partial VBPR contact 126 and the VBPR extension 142. Said differently, the VBPR contact 144 is a contact via which extends from a bottom surface of the backside power rail, as defined by the etch stop layer 132, to a top surface of the middle-of-line contact 124, as defined by the interface between the middle-of-line contact 124 and the source drain epitaxy 116.

As illustrated in FIGS. 21 and 22, the semiconductor structure represented by the structure 100 has some distinctive notable features. As described herein, the partial VBPR contact 126 is fabricated during frontside processing, and the VBPR extension 142 is fabricated during backside processing. Together, the partial VBPR contact 126 and the VBPR extension 142 make up the VBPR contact or contact via. Doing so produces a generally larger VBPR contact, and further lowers resistance. Similarly, the VBPR extension 142 is larger than typical VBPR contacts and thereby reduces contact resistance between the source drain epitaxy 116 and the corresponding backside power rail 140.

First, unlike VBPR contacts fabricated solely from either the frontside or backside, sidewalls of the VBPR extension 142 and the partial VBPR contact 126 are not planar, but instead have both a positive taper and a negative taper, respectively. Second, fabricating the partial VBPR contact 126 from the frontside, and the VBPR extension 142 from the backside maintains optimal power transmission and low resistance, while at the same time sufficiently minimizing, or reducing, the risk of tip-to-tip shorting. Doing so is only possible using embodiments of the present invention.

As such, the VBPR extension 142 (i.e. upper portion of the contact via) will have a positive tapered profile in which a lateral width at a bottom is less than a lateral width at the top, as illustrated. In contrast, partial VBPR contact 126 (i.e. lower portion of the contact via) will have a negative tapered profile in which a lateral width at a bottom is greater than a lateral width at the top, also as illustrated. The tapered profiles are a direct result of whether the contact via is fabricated during frontside processing or backside processing, as will be appreciated by persons having skill in the art.

Figure 23:
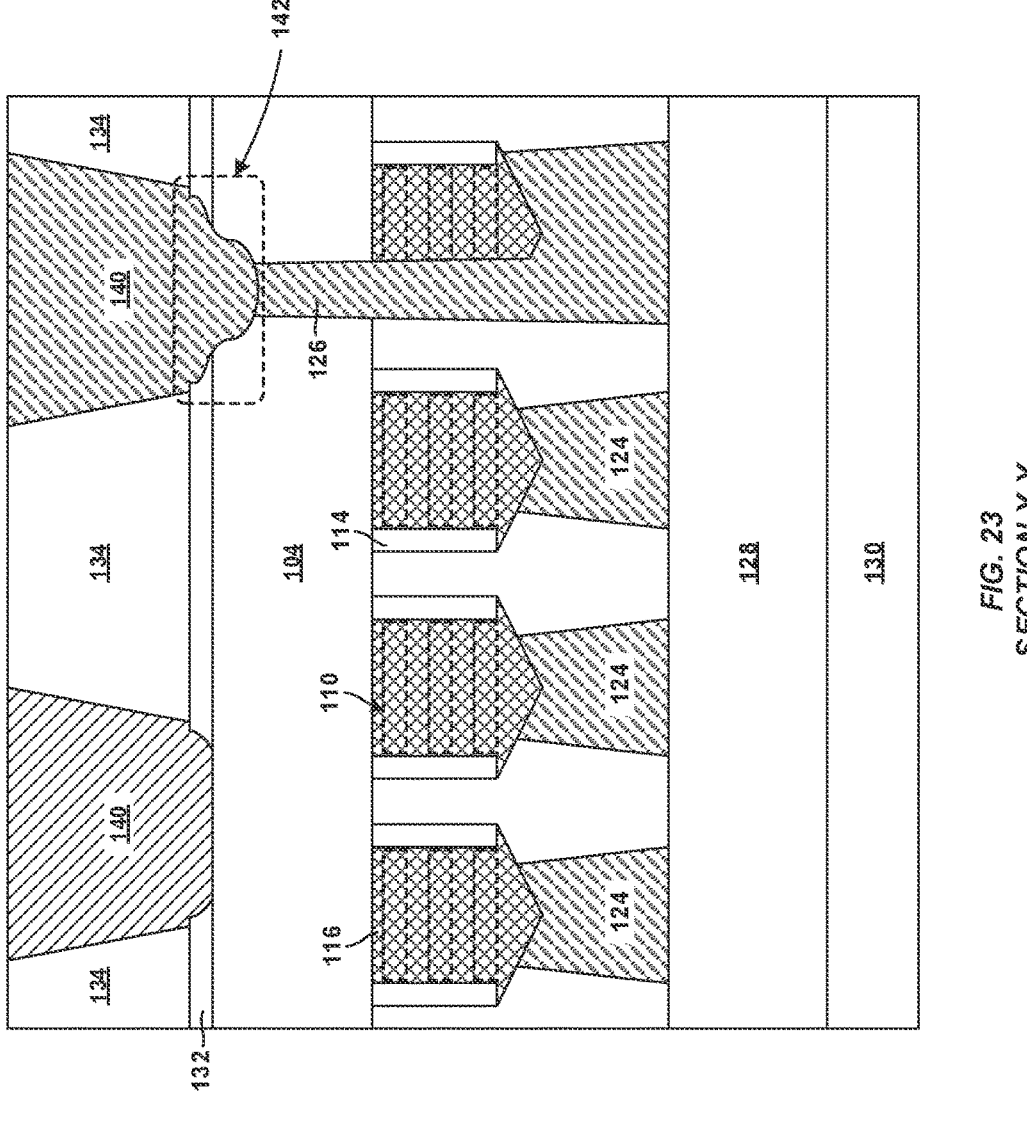
FIG. 23 depicts views of the semiconductor structure according to an alternative exemplary embodiment.

Referring now to FIG. 23, a structure 200 is shown according to an alternative embodiment. FIG. 23 depicts a cross-sectional view of the structure 100 shown in FIG. 21 taken along line Y-Y.

In the illustrated embodiment, the sacrificial material 122 is recessed to a level at or below a centerline of the buried dielectric layer 104, relative to FIG. 8, resulting in a smaller VBPR extension 142 see FIG. 23. As such, the cross-sectional area, or the volume, of the VBPR extension 142 is smaller thereby only marginally reducing contact resistance.

Figure 24:
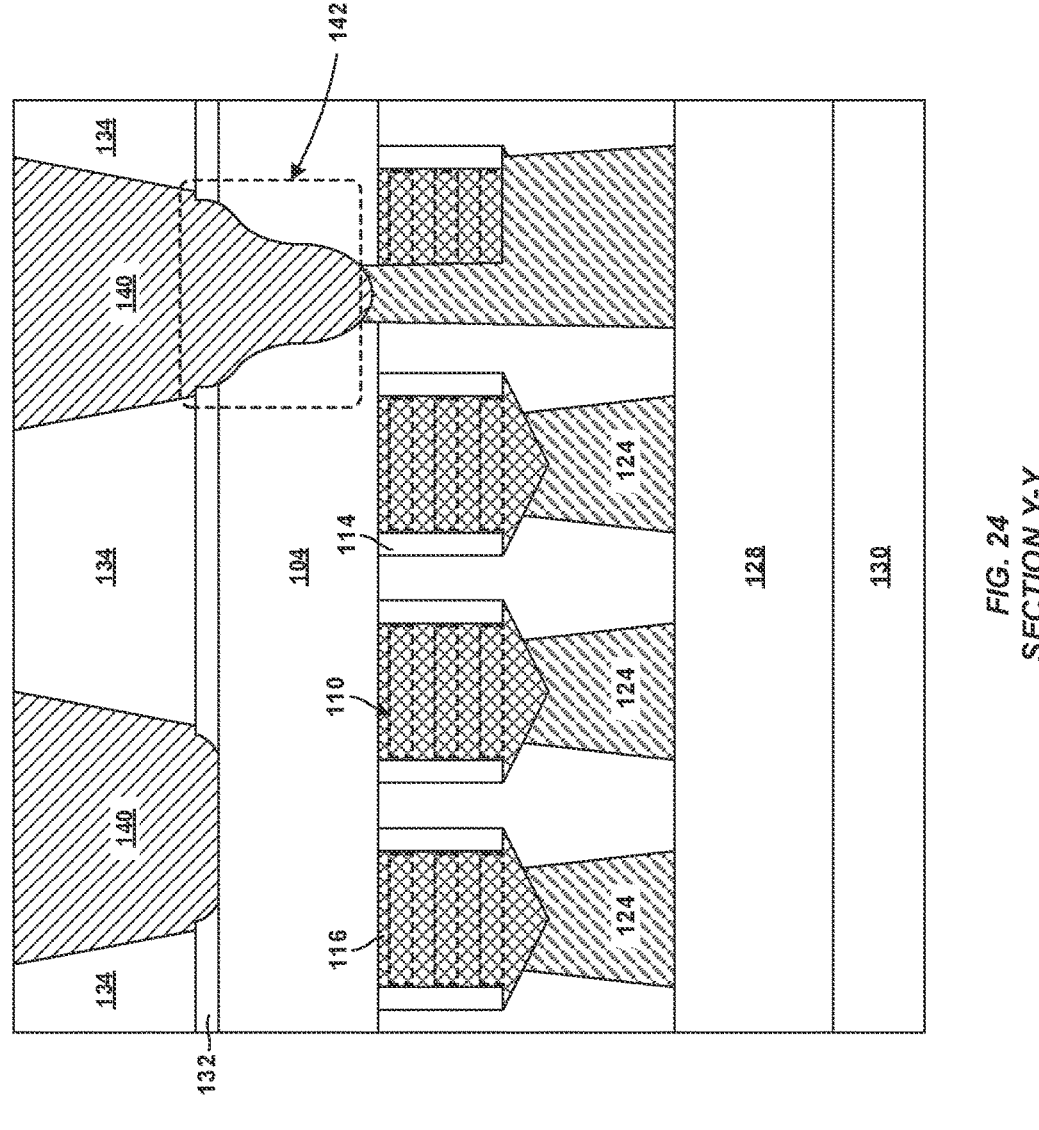
FIG. 24 depicts views of the semiconductor structure according to an alternative exemplary embodiment.

Referring now to FIG. 24, a structure 300 is shown according to an alternative embodiment. FIG. 23 depicts a cross-sectional view of the structure 100 shown in FIG. 21 taken along line Y-Y.

In the illustrated embodiment, the sacrificial material 122 is recessed to a level at or above a centerline of the buried dielectric layer 104, relative to FIG. 8, resulting in a larger VBPR extension 142, see FIG. 24. As such, the cross-sectional area, or the volume, of the VBPR extension 142 is larger thereby significantly reducing contact resistance. Despite significantly reducing contact resistance, doing so presents over etching concerns when preparing the VBPR opening 138.

Figure 25:
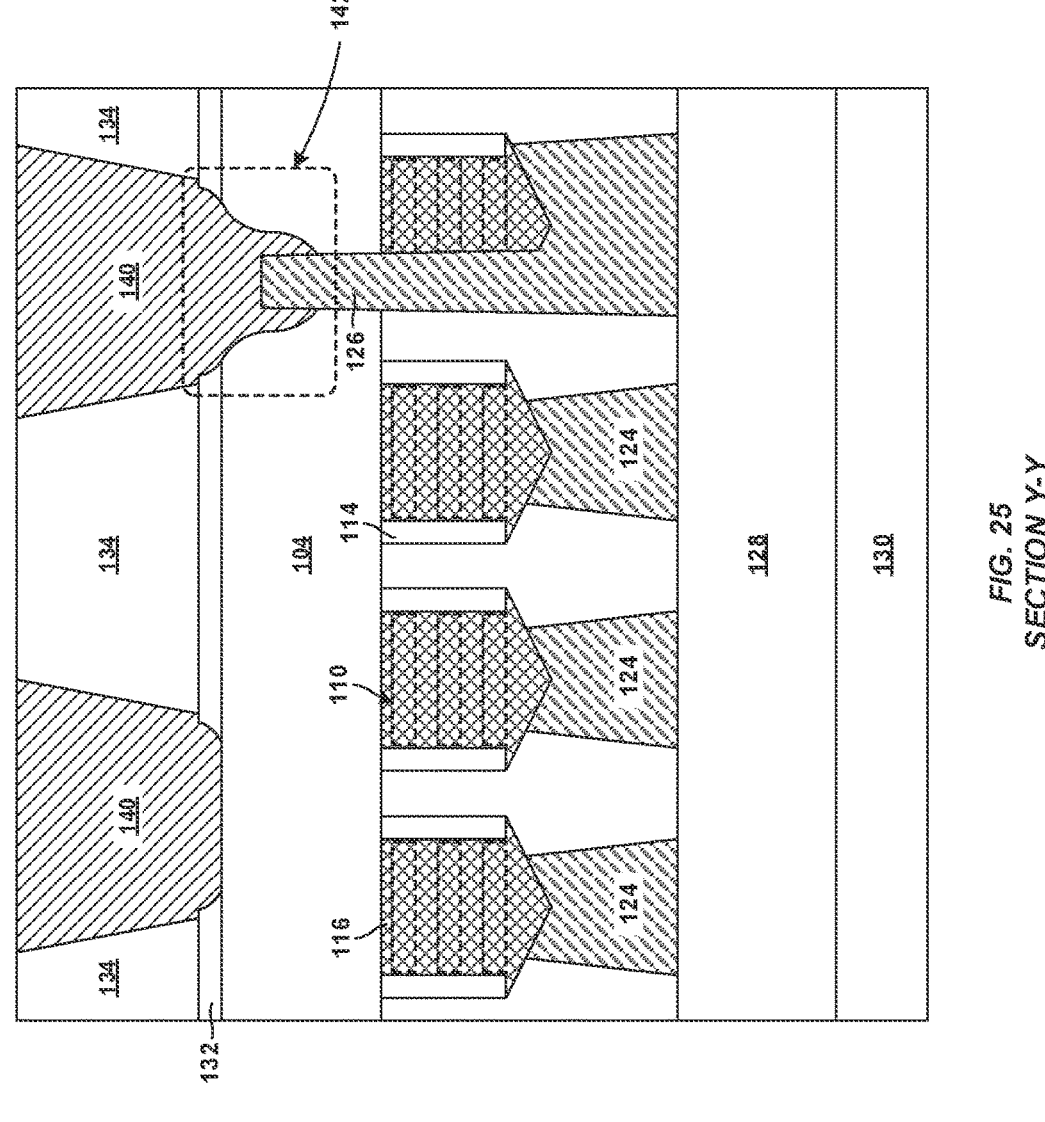
FIG. 25 depicts views of the semiconductor structure according to an alternative exemplary embodiment.

Referring now to FIG. 25, a structure 400 is shown according to an alternative embodiment. FIG. 23 depicts a cross-sectional view of the structure 100 shown in FIG. 21 taken along line Y-Y.

In the illustrated embodiment, the sacrificial material 122 is recessed to a level at or below a centerline of the buried dielectric layer 104, relative to FIG. 8. As described above, doing so would otherwise result in a smaller VBPR extension 142 except in the current example the directional etching applied to create the VBPR opening 138 is performed for a longer duration. Unlike above, the directional etching does not stop at merely exposing a top surface of the partial VBPR contact 126, but instead is continued until sidewalls of the partial VBPR contact 126 are exposed. For example, the directional etching may continue until a desired opening size is created, thereby eliminating some process variable inherent in previous embodiments. As such, the structure 400 is expected to have similar characteristics and benefits as the structure 100.

Referring now to FIGS. 26-55, a semiconductor structure represented by structure 500 is shown during an intermediate step of a method of fabricating a stacked transistor structure according to an embodiment of the invention.

Figures 26, 27, 28:
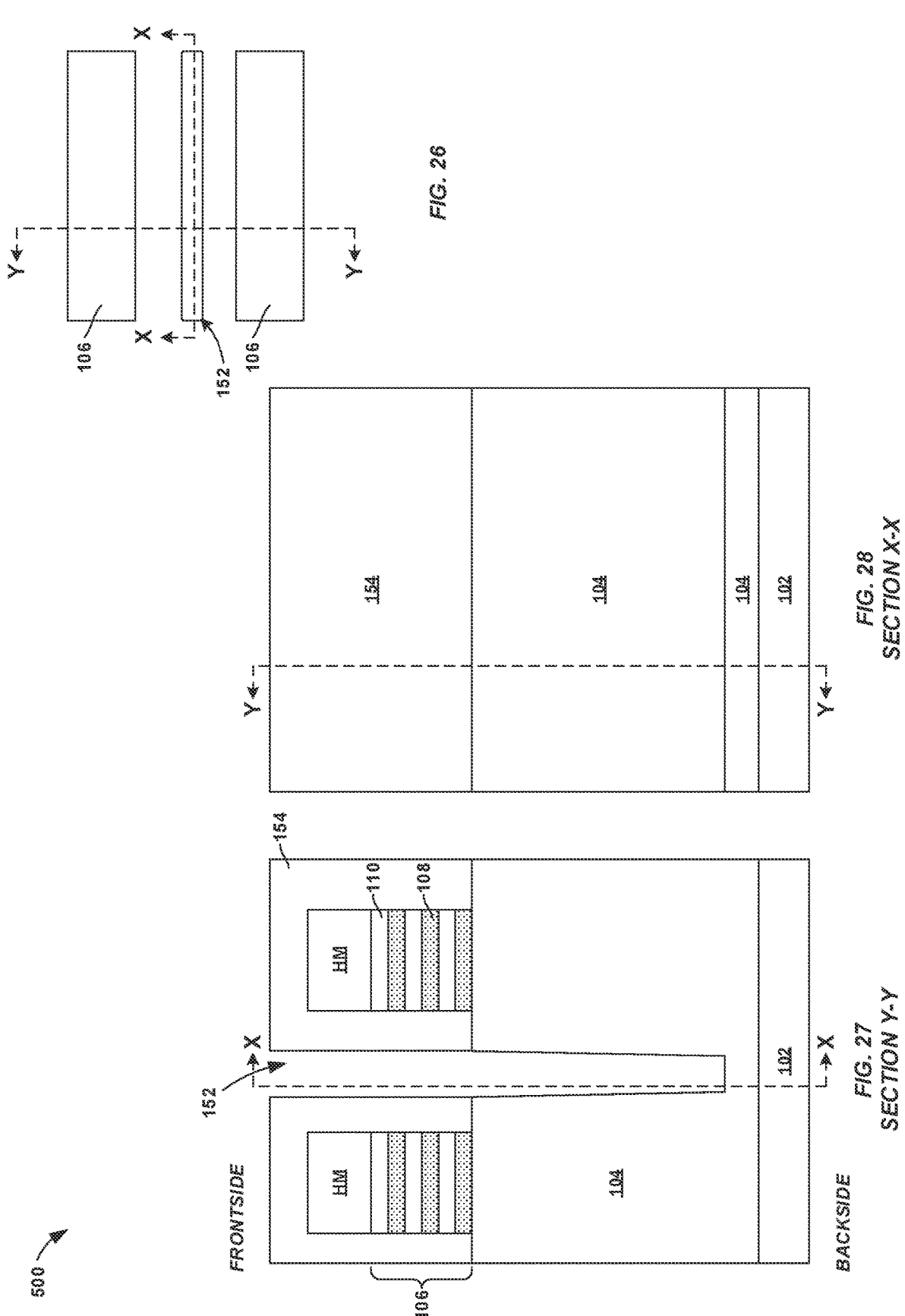
FIGS. 26, 27, and 28 depict views of a semiconductor structure during an intermediate step of a method of fabricating a transistor structure according to an exemplary embodiment.

Referring now to FIGS. 26, 27, and 28, the structure 500 is shown after providing a substrate 102, a buried dielectric layer 104, and forming nanosheet stacks 106 on the buried dielectric layer 104 according to an embodiment of the invention. FIG. 26 is a representative illustration of a top view of the structure 500 omitting some materials and layers, for example, patterning layers, masking layers and interlevel dielectrics. As such, only pertinent conductive layers and components are shown in the top views to provide a clear understanding of their relative orientation. FIG. 27 depicts a cross-sectional view of the structure 500 shown in FIG. 26 taken along line Y-Y, and FIG. 28 depicts a cross-sectional view of the structure 500 shown in FIG. 26 taken along line X-X. It is noted, FIGS. 1-12 and their corresponding descriptions are directed at frontside processing, while FIGS. 13-22 and their corresponding descriptions are directed at backside processing.

After providing the substrate 102, the buried dielectric layer 104, and forming the nanosheet stacks 106 on the buried dielectric layer 104 as described above with reference to FIG. 1, a backside power rail trench 152 is formed using known patterning and etching techniques.

First, a mask 154 is deposited and subsequently patterned to expose certain portions of the structure 100 according to known techniques. According to an embodiment, the mask 154 can be an organic planarization layer or a layer of material that is capable of being planarized, etched, or patterned by known techniques. In an embodiment, for example, the mask 154 can be an amorphous carbon layer able to withstand subsequent processing temperatures. The mask 154 can preferably have a thickness sufficient to cover and protect existing structures during subsequent processing. After depositing the mask 154, a dry etching technique is applied to pattern the mask 154. In a preferred embodiment, patterning the mask 154 exposes a small portion of the buried dielectric layer 104 positioned between adjacent nanosheet stacks 106, as shown in FIG. 27. In all cases, the pattern in the mask 154 must be carefully positioned between adjacent cells without exposing any portion of the nearby nanosheet stacks 106. Said differently, the nanosheet stacks 106 must remain covered and protected by the mask 154 while forming the backside power rail trench 152.

Next, known high aspect ratio etching techniques may be applied to etch the backside power rail trench 152 into the buried dielectric layer 104. Specifically, a portion of the buried dielectric layer 104 is removed selective to the mask 154. For example, high aspect ratio etching techniques, suitable to remove dielectrics selective to the organic planarization layer may be applied. In at least an embodiment, a directional dry etch technique, such as reactive ion etching, is used to etch the buried dielectric layer 104 and form the backside power rail trench 152.

In all cases, the backside power rail trench 152 must extend below centerline of the buried dielectric layer 104 without exposing the substrate 102. If the backside power rail trench 152 extends to a level at or above the centerline of the buried dielectric layer 104, subsequent processing will be affected, as described below with reference to FIGS. 41-43.

Because the spacing between adjacent transistors, measured in the y-direction, is very small, the aspect ratio of the backside power rail trench 152 must be equal to or greater than 6:1. Stated differently, the backside power rail trench 152 will need to be about 6 times deeper than its width in order to (a) fit between adjacent cells, and (b) extend deep enough into the buried dielectric layer 104. For example, if a lateral spacing between adjacent nanosheet stacks 106 is about 30-50 nm and the thickness, or height, of the buried dielectric layer 104 is about 100-300 nm, then the backside power rail trench 152 may be about 12-38 nm wide and at least 150 nm deep.

Figures 29, 30, 31:
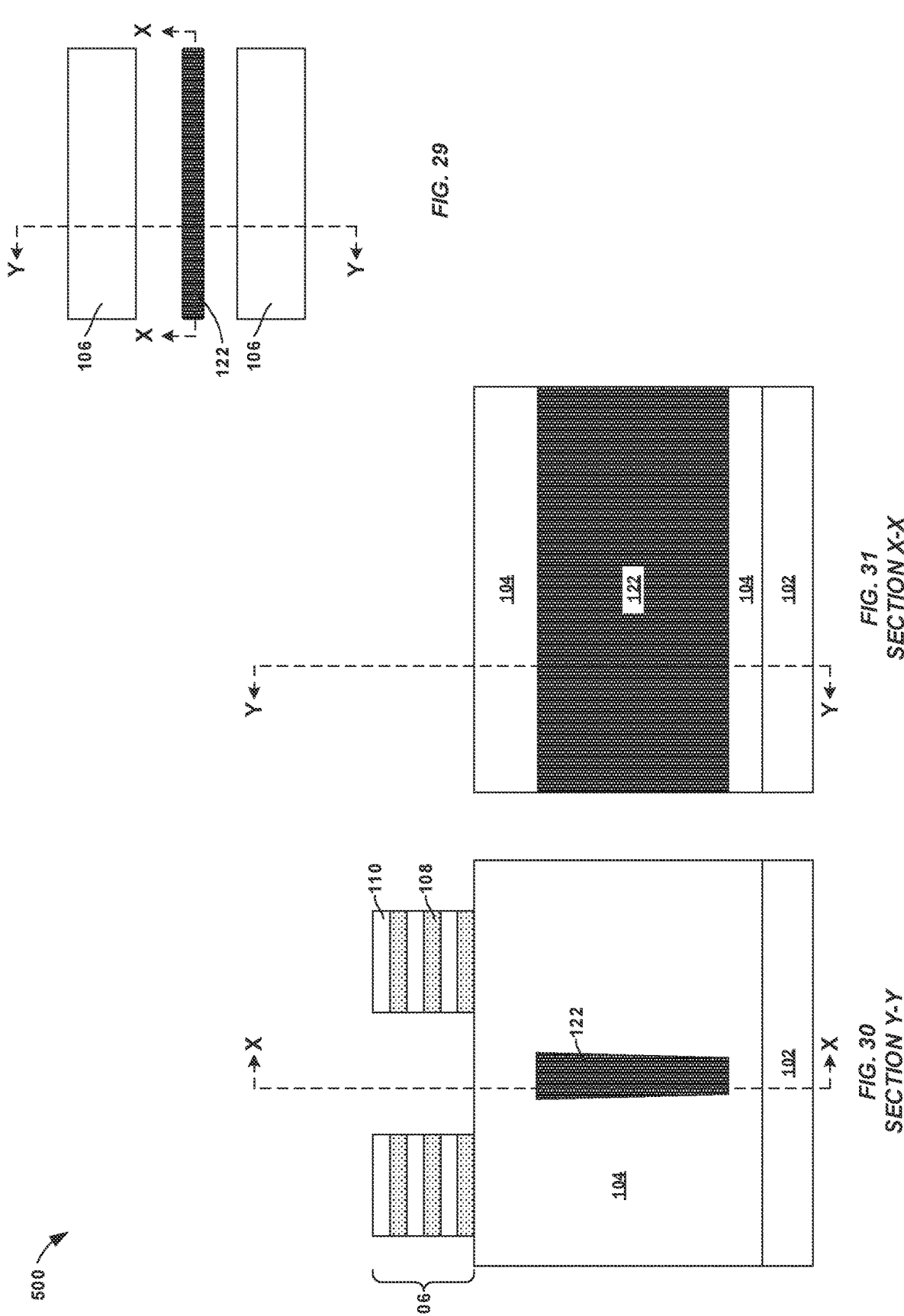
FIGS. 29, 30, and 31 depict views of a semiconductor structure after filling the VBPR trench with a sacrificial material, recessing the sacrificial material, and backfilling the VBPR trench according to an exemplary embodiment.

Referring now to FIGS. 29, 30, and 31, the structure 500 is shown after filling the backside power rail trench 152 with a sacrificial material 122, recessing the sacrificial material 122, and backfilling the backside power rail trench 152 according to an embodiment of the invention. FIG. 29 is a representative illustration of a top view of the structure 500 omitting some features as described above with reference to FIG. 26. FIG. 30 depicts a cross-sectional view of the structure 500 shown in FIG. 29 taken along line Y-Y, and FIG. 31 depicts a cross-sectional view of the structure 500 shown in FIG. 29 taken along line X-X.

First, the sacrificial material 122 is deposited in the backside power rail trench 152 and then subsequently recessed according to known techniques, and as described above. Next, the backside power rail trench 152 is backfilled with a dielectric material. In doing so, the mask 154 and HM are removed according to known techniques.

In the present embodiment, the sacrificial material 122 is recessed to a depth at or below the nanosheet stacks 106, as illustrated. For example, a target depth may be at or above the centerline of the buried dielectric layer 104, but also maintaining a sufficient thickness of dielectric backfill material between the sacrificial material 122 and the nanosheet stack 106 to protect the nanosheet stack 106 during subsequent backside processing.

Like described above, the sacrificial material 122 can be any material that which may be subsequently removed selective to selective to the buried dielectric layer 104. For example, the sacrificial material 122 may be made from TiO, AlO, SiOC, AlN, or others.

Figures 32, 33, 34:
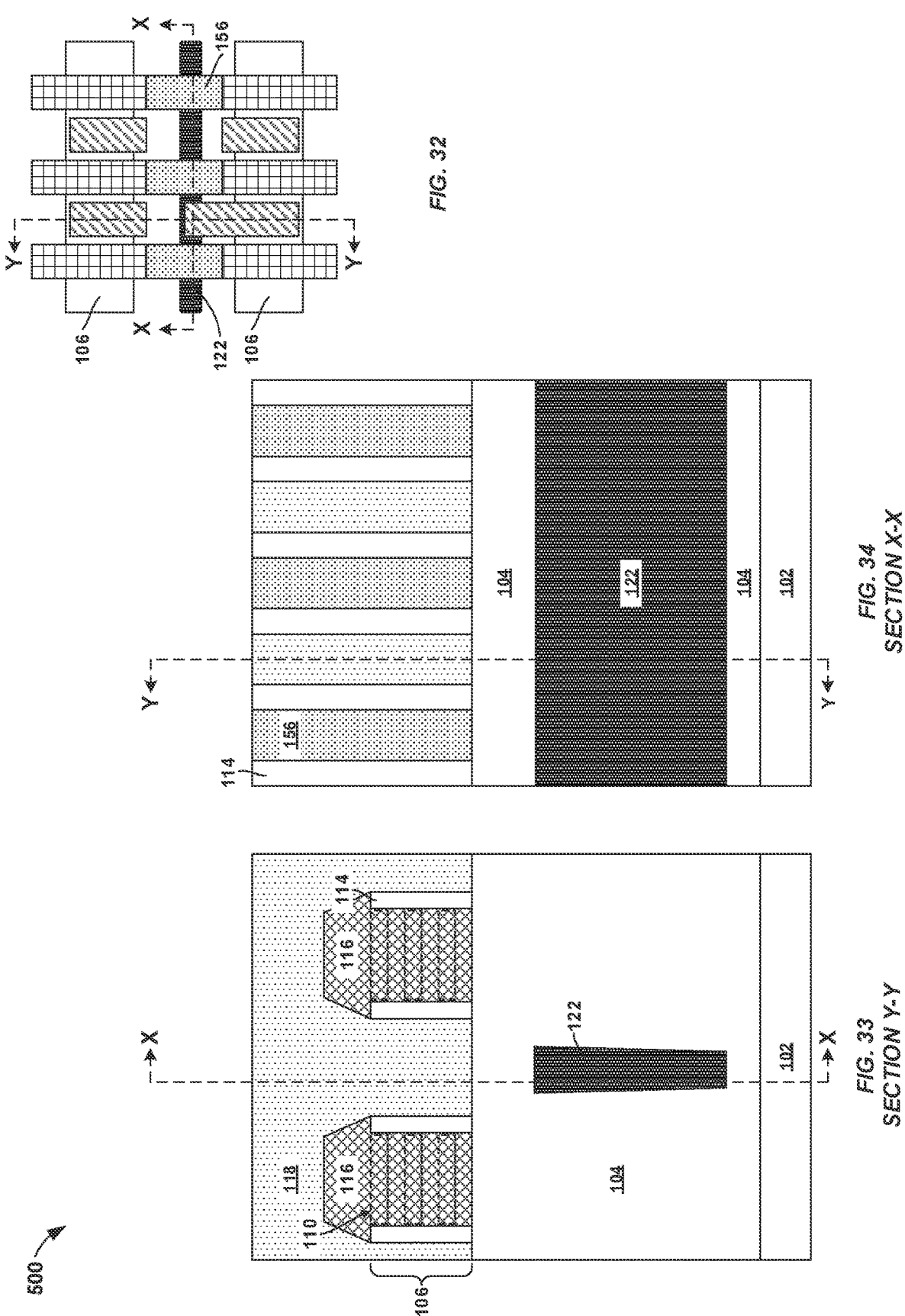
FIGS. 32, 33, and 34 depict views of a semiconductor structure after forming metal gate lines, gate spacers, inner spacers (not shown), and source drain epitaxy according to an exemplary embodiment.

Referring now to FIGS. 32, 33, and 34, the structure 500 is shown after forming high-k metal gate lines 112, gate spacers 114, inner spacers (not shown), source drain epitaxy 116, and a gate cut 156 according to an embodiment of the invention. FIG. 32 is a representative illustration of a top view of the structure 500 omitting some features as described above with reference to FIG. 26. FIG. 33 depicts a cross-sectional view of the structure 500 shown in FIG. 32 taken along line Y-Y, and FIG. 31 depicts a cross-sectional view of the structure 500 shown in FIG. 32 taken along line X-X.

According to known techniques, the high-k metal gate lines 112, the gate spacers 114, the inner spacers, and the source drain epitaxy 116, the gate cut 156 are formed using conventional nanosheet and replacement metal gate techniques. For example, dummy gate lines are first patterned perpendicular to the nanosheet stacks 106. Next, the gate spacers 114 are disposed on opposite and exposed sidewalls of each the dummy gate lines and the nanosheet stacks 106 in a typical fashion. Additionally, the sacrificial nanosheets 108 are laterally recessed beneath the dummy gate lines and inner spacers are formed according to known techniques. The inner spacers will separate the high-k metal gate lines 112 from the source drain epitaxy 116. Next, and the source drain epitaxy 116 is grown on exposed surfaces of the channel nanosheets 110 between the dummy gate lines. Next, a dielectric layer 118, such as, a known interlevel dielectric material, is blanket deposited and polished flat. Finally, unwanted gate is cut and replaced with the gate 156, or dielectric fill, followed by selective removal of the dummy gate lines and portions of the sacrificial nanosheets 108 beneath the dummy gate lines. Next the high-k metal gate lines 112, otherwise known as replacement metal gates, are formed using known processes and techniques.

Figures 35, 36, 37:
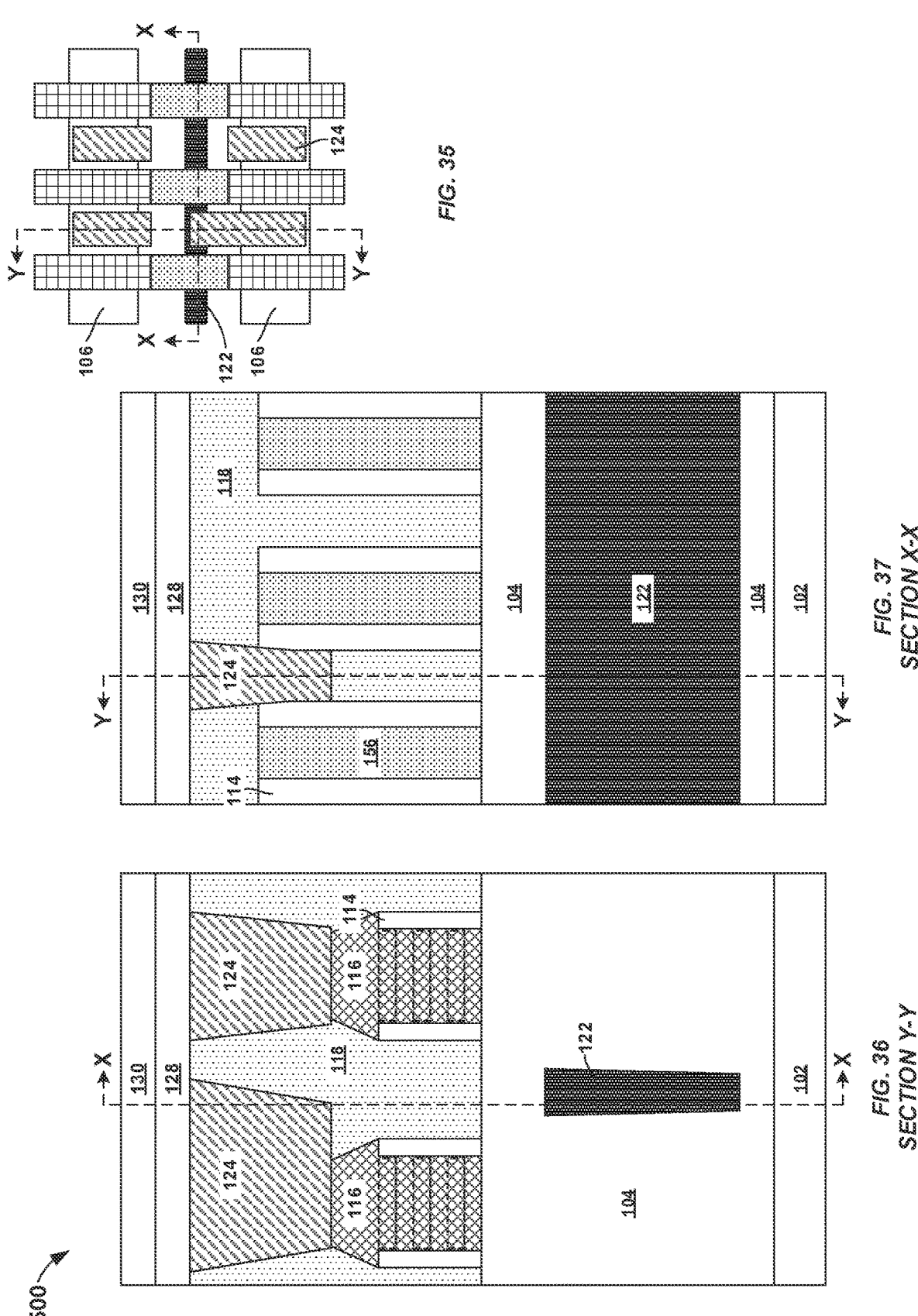
FIGS. 35, 36, and 37 depict views of a semiconductor structure after forming middle-of-line contacts, forming back-end-of-line layers and securing a carrier wafer according to an exemplary embodiment.

Referring now to FIGS. 35, 36, and 37, the structure 500 is shown after forming middle-of-line contacts 124, forming back-end-of-line layers 128 and securing a carrier wafer 130 according to an embodiment of the invention. FIG. 35 is a representative illustration of a top view of the structure 500 omitting some features as described above with reference to FIG. 26. FIG. 36 depicts a cross-sectional view of the structure 500 shown in FIG. 35 taken along line Y-Y, and FIG. 37 depicts a cross-sectional view of the structure 500 shown in FIG. 35 taken along line X-X.

Like above, the middle-of-line contacts 124 are formed in the dielectric layer 118 and followed by forming the back-end-of-line layers 128. Next, a carrier wafer 130 is attached, or removably secured, to the back-end-of-line layers 128, also like above.

Figures 38, 39, 40:
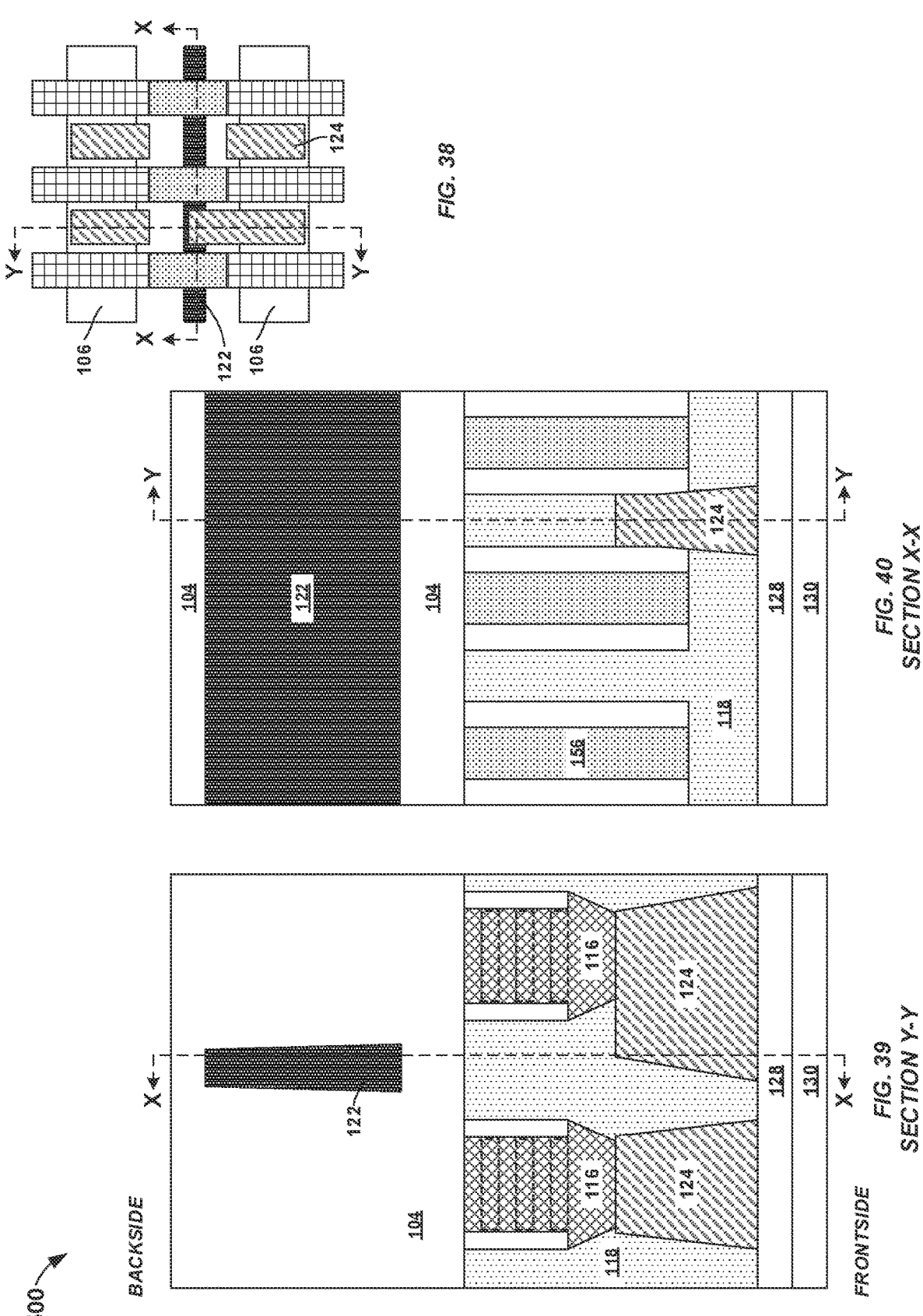
FIGS. 38, 39, and 40 depict views of a semiconductor structure after flipping the assembly and removing the substrate according to an exemplary embodiment.

Referring now to FIGS. 38, 39, and 40, the structure 500 is shown after flipping the assembly and removing the substrate 102 according to an embodiment of the invention. FIG. 38 is a representative illustration of a top view of the structure 500 omitting some features as described above with reference to FIG. 26. FIG. 39 depicts a cross-sectional view of the structure 500 shown in FIG. 38 taken along line Y-Y, and FIG. 40 depicts a cross-sectional view of the structure 500 shown in FIG. 38 taken along line X-X. The assembly is flipped and Like above, the structure 500 is flipped 180 degrees to prepare for backside processing, and the substrate 102 is removed selective to the buried dielectric layer 104 according to known techniques.

Figures 41, 42, 43:
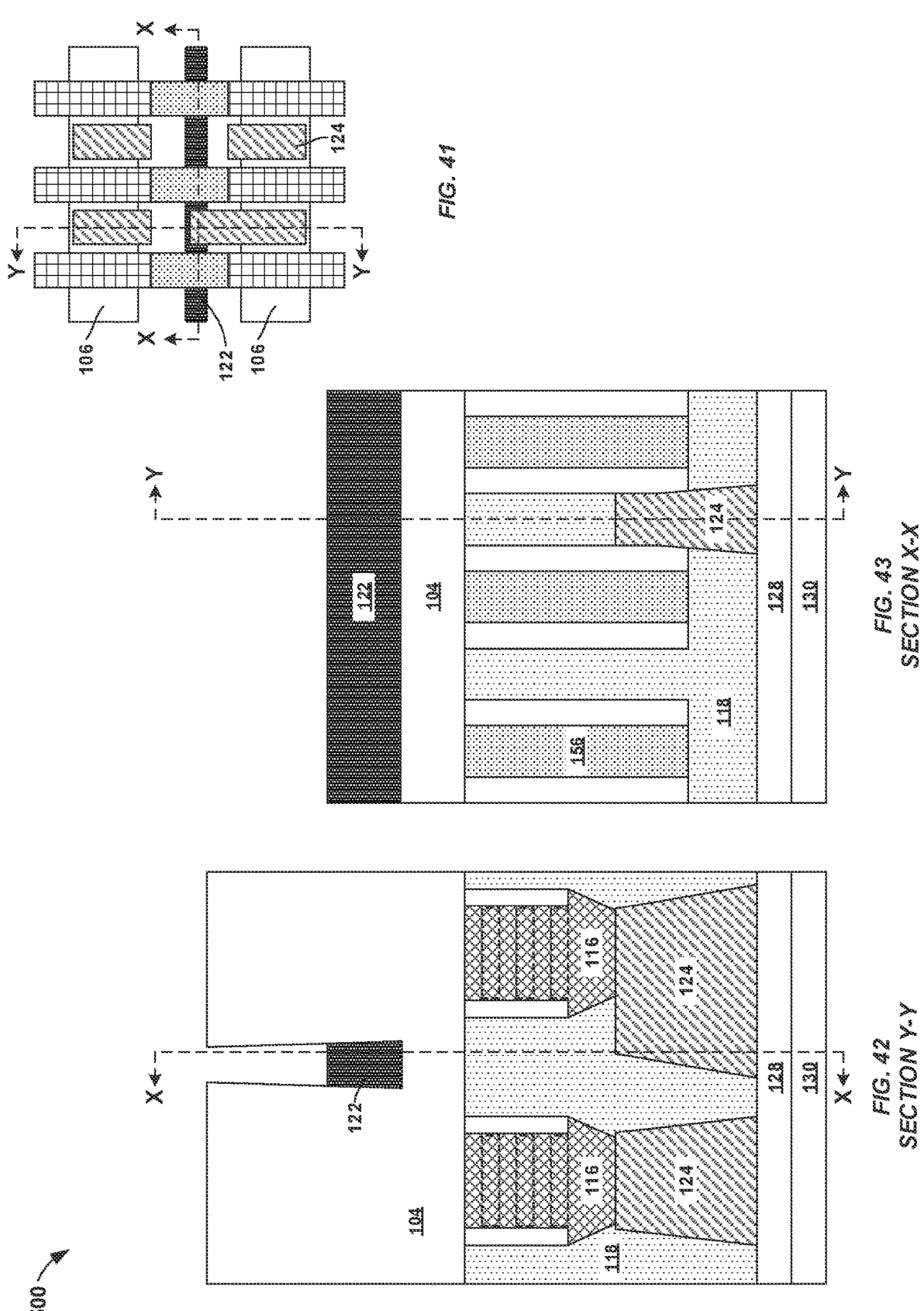
FIGS. 41, 42, and 43 depict views of a semiconductor structure after recessing the buried dielectric layer to expose the sacrificial material according to an exemplary embodiment.

Referring now to FIGS. 41, 42, and 43, the structure 500 is shown after recessing the buried dielectric layer 104 to expose the sacrificial material 122 according to an embodiment of the invention. FIG. 41 is a representative illustration of a top view of the structure 500 omitting some features as described above with reference to FIG. 26. FIG. 42 depicts a cross-sectional view of the structure 500 shown in FIG. 41 taken along line Y-Y, and FIG. 43 depicts a cross-sectional view of the structure 500 shown in FIG. 41 taken along line X-X.

First, the buried dielectric layer 104 is recessed to expose the sacrificial material 122 using known oxide etching techniques. As previously indicated above, if the backside power rail trench 152 does not extend below centerline of the buried dielectric layer 104, with reference to FIG. XX, excessive recessing of the buried dielectric layer 104 would be required to expose the sacrificial material 122. Next, like above, the sacrificial material 122 is recessed as illustrated. Specifically, the sacrificial material 122 is recessed to a depth equal to about a desired thickness of a subsequently formed backside power rail (see FIGS. 54 and 55).

In the illustrated embodiment, the sacrificial material 122 need only be capable of being removed selective to the buried dialectic layer 104, and thus could be a different material than required in the structure 100 described above.

Figures 44, 45, 46:
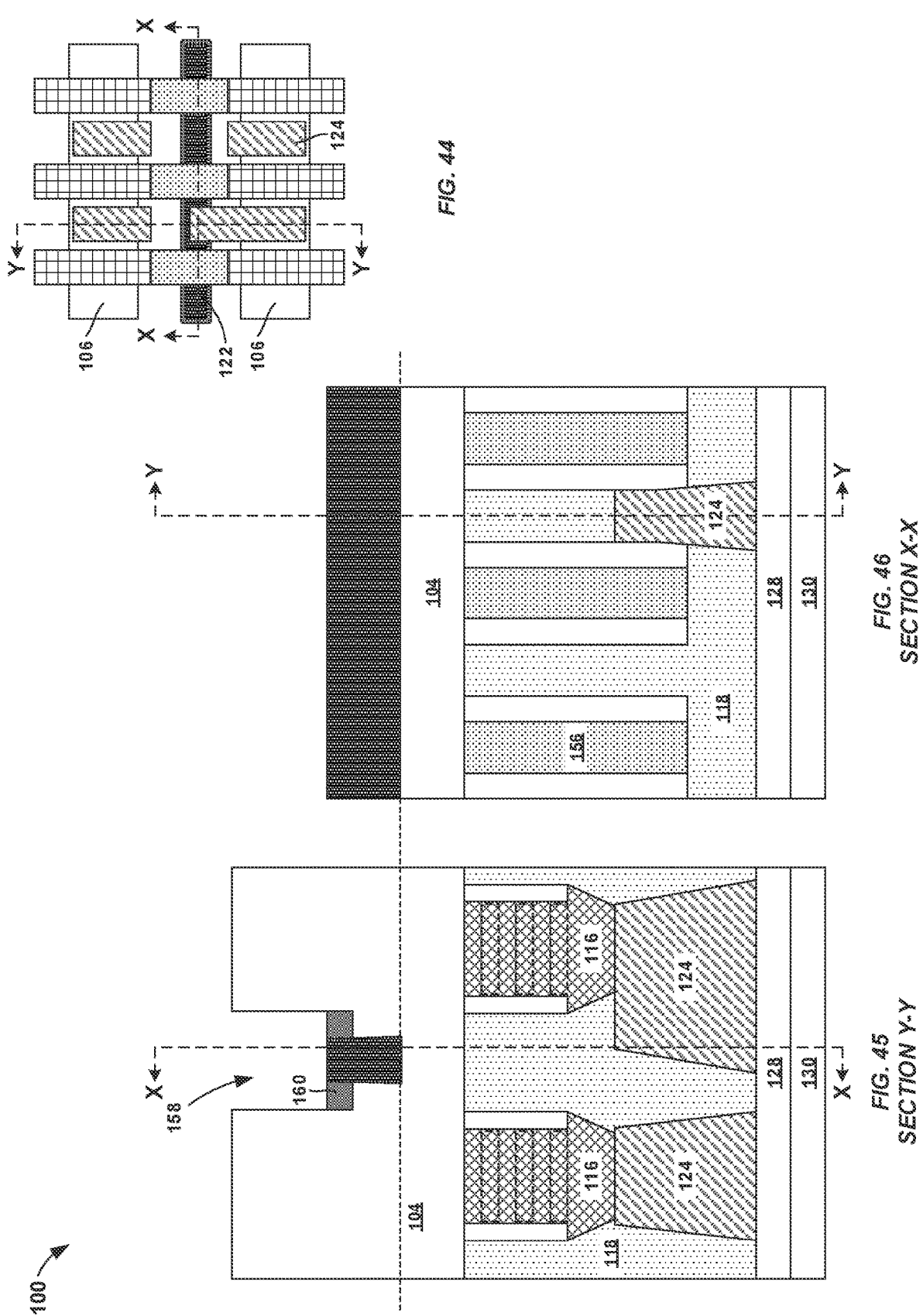
FIGS. 44, 45, and 46 depict views of a semiconductor structure after forming a backside power rail trench (hereinafter "BPR trench") and an edge spacer according to an exemplary embodiment.

Referring now to FIGS. 44, 45, and 46, the structure 500 is shown after forming an enlarged backside power rail trench 158 (hereinafter "enlarged BPR trench 158") and an edge spacer 160 according to an embodiment of the invention. FIG. 44 is a representative illustration of a top view of the structure 500 omitting some features as described above with reference to FIG. 26. FIG. 45 depicts a cross-sectional view of the structure 500 shown in FIG. 44 taken along line Y-Y, and FIG. 46 depicts a cross-sectional view of the structure 500 shown in FIG. 44 taken along line X-X.

First, the buried dielectric layer 104 is isotropically etched to form the enlarged BPR trench 158 according to known techniques. In doing so, a portion of the buried dielectric layer 104 is removed selective to the sacrificial material 122. In all cases, etching continues until an upper portion of the sacrificial material 122 is exposed and a recess, or moat, is formed around the upper portion of the sacrificial material 122. In at least an embodiment, the enlarged BPR trench 158 may have a width, in the y-direction, ranging from about 32 nm to about 70 nm.

Next, the edge spacer 160 is deposited in the recess surrounding a top portion of the sacrificial material 122 according to known techniques. The edge spacer 160 can be any material that which may allow etching or removal of the sacrificial material 122 and protect the buried dielectric layer 104. Said differently, the edge spacer 160 may be made from typical etch stop materials, for example TiN, which allow the sacrificial material 122 to be etched or removed selective to the edge spacer 160. The edge spacer 160 are specifically designed to preserve the shape of the BPR trench 158. Otherwise, without the edge spacer 160, subsequent removal of the sacrificial material 122 and underlying dielectrics would further etch exposed corners and sidewalls of the buried dielectric layer 104 and further expand the enlarged BPR trench 158. It is an object of the present invention to introduce the edge spacer 160 to prevent such expansion.

Figures 47, 48, 49:
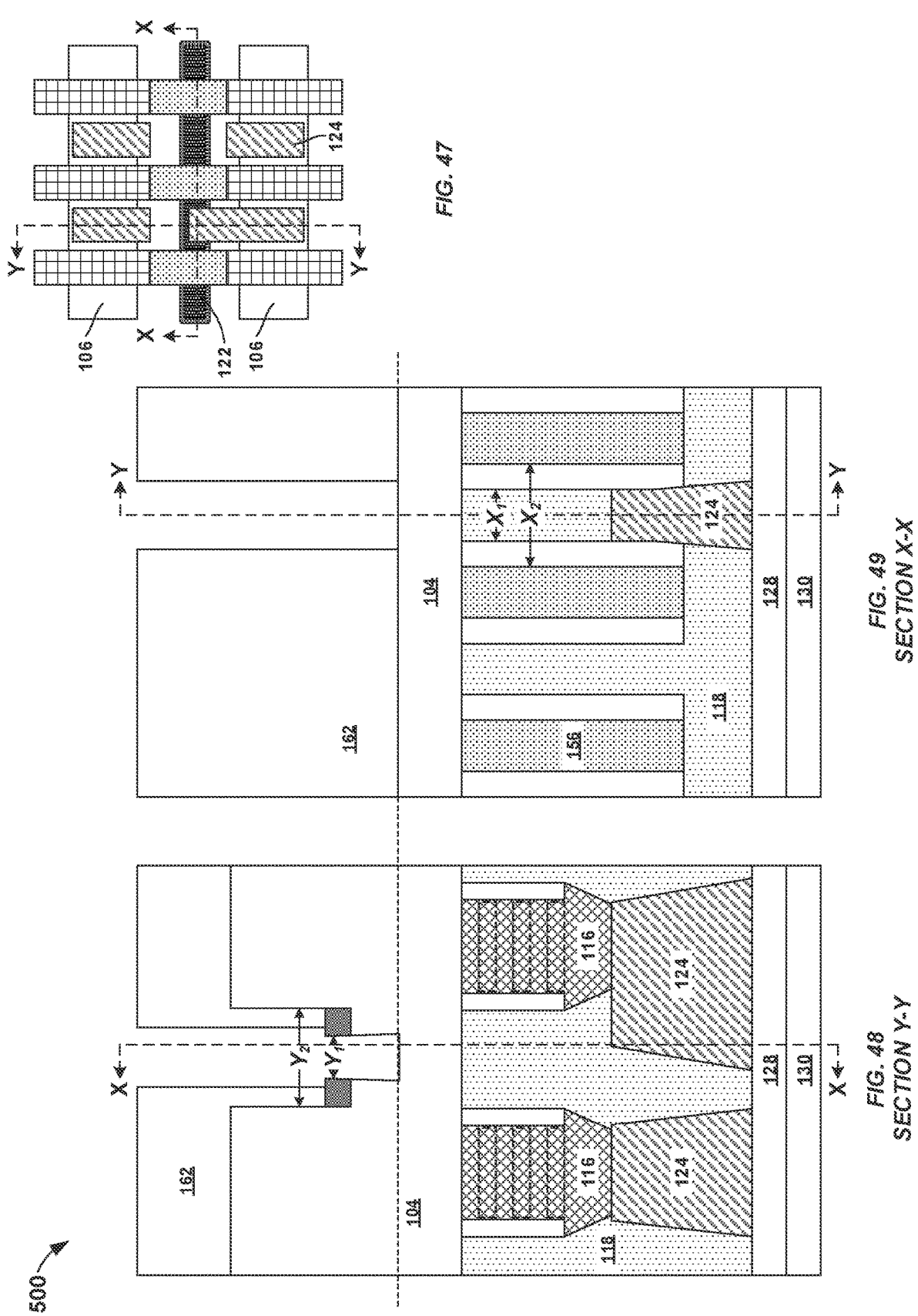
FIGS. 47, 48, and 49 depict views of a semiconductor structure after forming a mask and completely removing the sacrificial material according to an exemplary embodiment.

Referring now to FIGS. 47, 48, and 49, the structure 500 is shown after forming a VBPR mask 162 and completely removing the sacrificial material 122 according to an embodiment of the invention. FIG. 47 is a representative illustration of a top view of the structure 500 omitting some features as described above with reference to FIG. 26. FIG. 48 depicts a cross-sectional view of the structure 500 shown in FIG. 47 taken along line Y-Y, and FIG. 49 depicts a cross-sectional view of the structure 500 shown in FIG. 49 taken along line X-X.

First, the VBPR mask 162 is deposited and subsequently patterned to expose certain portions of the structure 100 according to known techniques. Specifically, the enlarged BPR trench 158 is exposed, as illustrated in FIG. 48. Additionally, a width, in y-direction, of the opening patterned in the VBPR mask 162 should be greater than a width $(Y_1)$ of a bottom of the enlarged BPR trench 158 (previously the VBPR trench 120), but less than a width $(Y_2)$ of the enlarged BPR trench 158, and a width, in x-direction, of the opening patterned in the VBPR mask 162 should be greater than a distance $(X_1)$ between adjacent gate spacers 114, but less than a distance $(X_2)$ between adjacent high-k metal gate lines 112.

According to an embodiment, the VBPR mask 162 can be an organic planarization layer or a layer of material that is capable of being planarized, etched, or patterned by known techniques. The VBPR mask 162 can preferably have a thickness sufficient to cover and protect existing structures during subsequent processing. After depositing the VBPR mask 162, a dry etching technique is applied to pattern the VBPR mask 162. Although general alignment of the VBPR mask 162 is important, there is some room for misalignment provided by the edge spacer 160. The object of the VBPR mask 162 is to protect the buried dielectric layer 104 from subsequent etching techniques used to remove the sacrificial material 122.

Next, known etching techniques may be applied to completely remove the sacrificial material 122 from a bottom of the enlarged BPR trench 158 (previously the VBPR trench 120). As such, removing the sacrificial material 122 from a bottom of the enlarged BPR trench 158 is a self-aligned process using the edge spacer 160 which function as an etch stop or hard mask. In at least an embodiment, a directional dry etch technique, such as reactive ion etching, is used to remove the sacrificial material 122. Despite existence of the edge spacer 160 and the directional etching, portions of the enlarged BPR trench 158 below the edge spacer 160 may experience some expansion or widening.

Figures 50, 51, 52:
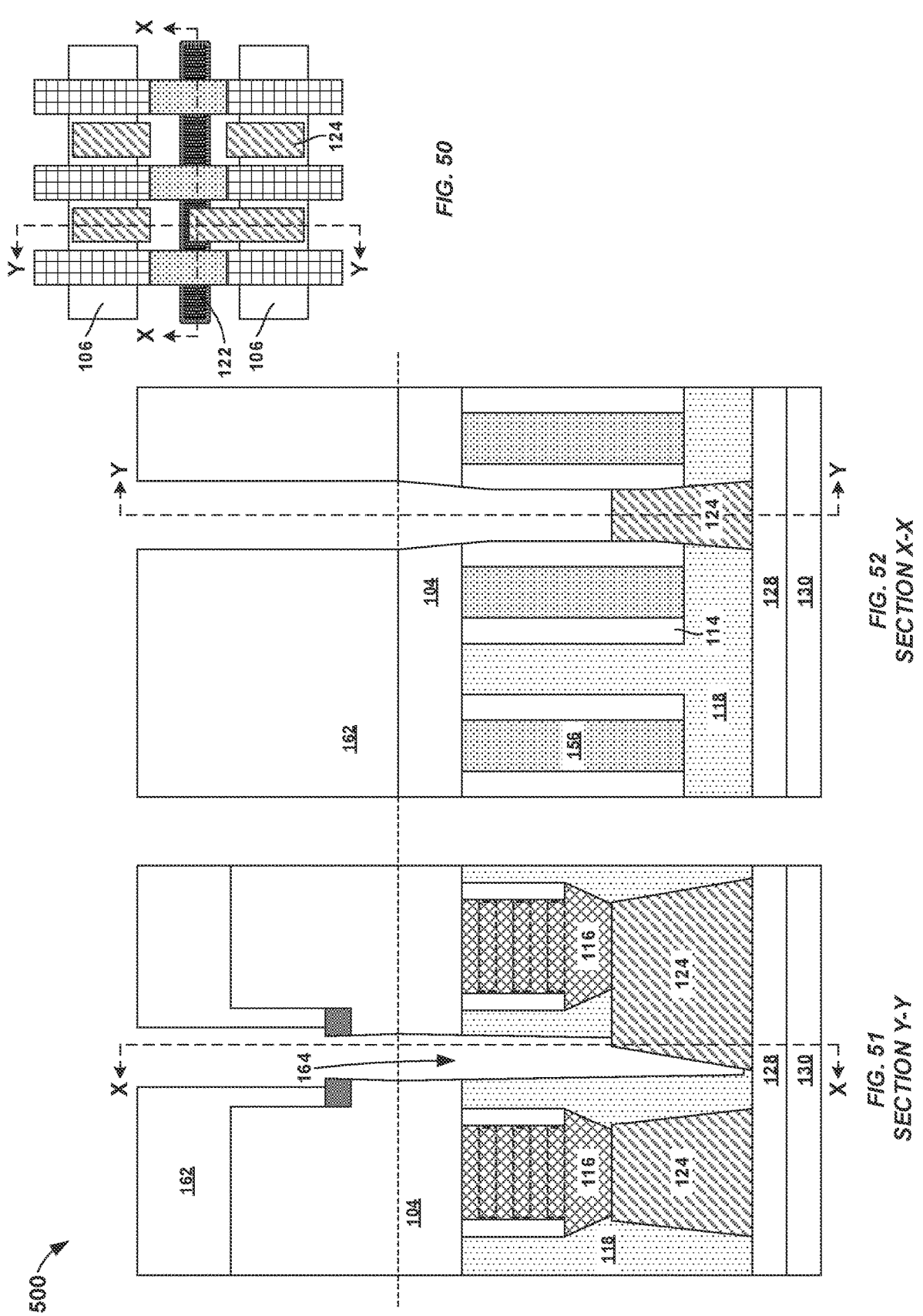
FIGS. 50, 51, and 52 depict views of a semiconductor structure after forming a VBPR trench extension according to an exemplary embodiment.

Referring now to FIGS. 50, 51, and 52, the structure 500 is shown after forming a VBPR trench 164 according to an embodiment of the invention. FIG. 50 is a representative illustration of a top view of the structure 500 omitting some features as described above with reference to FIG. 26. FIG. 51 depicts a cross-sectional view of the structure 500 shown in FIG. 50 taken along line Y-Y, and FIG. 52 depicts a cross-sectional view of the structure 500 shown in FIG. 50 taken along line X-X.

Known etching techniques may be applied to etch through buried dielectric layer 104 and the dielectric layer 118 to expose the source drain epitaxy 116, as illustrated. Specifically, portions of the buried dielectric layer 104 and the dielectric layer 118 are removed selective to the VBPR mask 162, the edge spacer 160, and the gate spacers 114. Etching the VBPR trench 164 is a fully self-aligned process using the edge spacer 160, in the y-direction, and the gate spacers 114, x-direction, as illustrated in FIG. 52. In at least an embodiment, a directional dry etch technique, such as reactive ion etching, is used to etch through buried dielectric layer 104 and the dielectric layer 118 and form the VBPR trench 164.

The VBPR trench 164 may have a relative width, in the y-direction, similar to the width of the original backside power rail trench 152, as described above with reference to FIG. 27. More specifically, according to the present embodiment, a relative width of the BPR enlarged trench 158 is defined by the width of the original backside power rail trench 152. Similarly, a relative position of the enlarged BPR trench 158 is also defined by the relative position of the original backside power rail trench 152.

Of note, the bottom of the enlarged BPR trench 158 will have a negative tapered profile in which a lateral width at a bottom is greater than a lateral width at the top, as illustrated. In contrast, the VBPR trench 164 will have a positive tapered profile in which a lateral width at a bottom is smaller than a lateral width at the top. The tapered profiles are a direct result of whether a trench is etched during frontside processing or backside processing, as will be appreciated by persons having skill in the art.

Additionally, a relatively large sidewall of the middle-of-line contact 124 is exposed at a bottom of the VBPR trench 164 despite the relatively narrow profile or width of the VBPR trench 164. Therefore, despite forming the VBPR trench 164 during backside processing, low contact resistance between the middle-of-line contact 124 and subsequent VBPR contact is maintained.

Finally, after removing the sacrificial material 122 the VBPR mask 162, for example the OPL, is removed by ashing.

Figures 53, 54, 55:
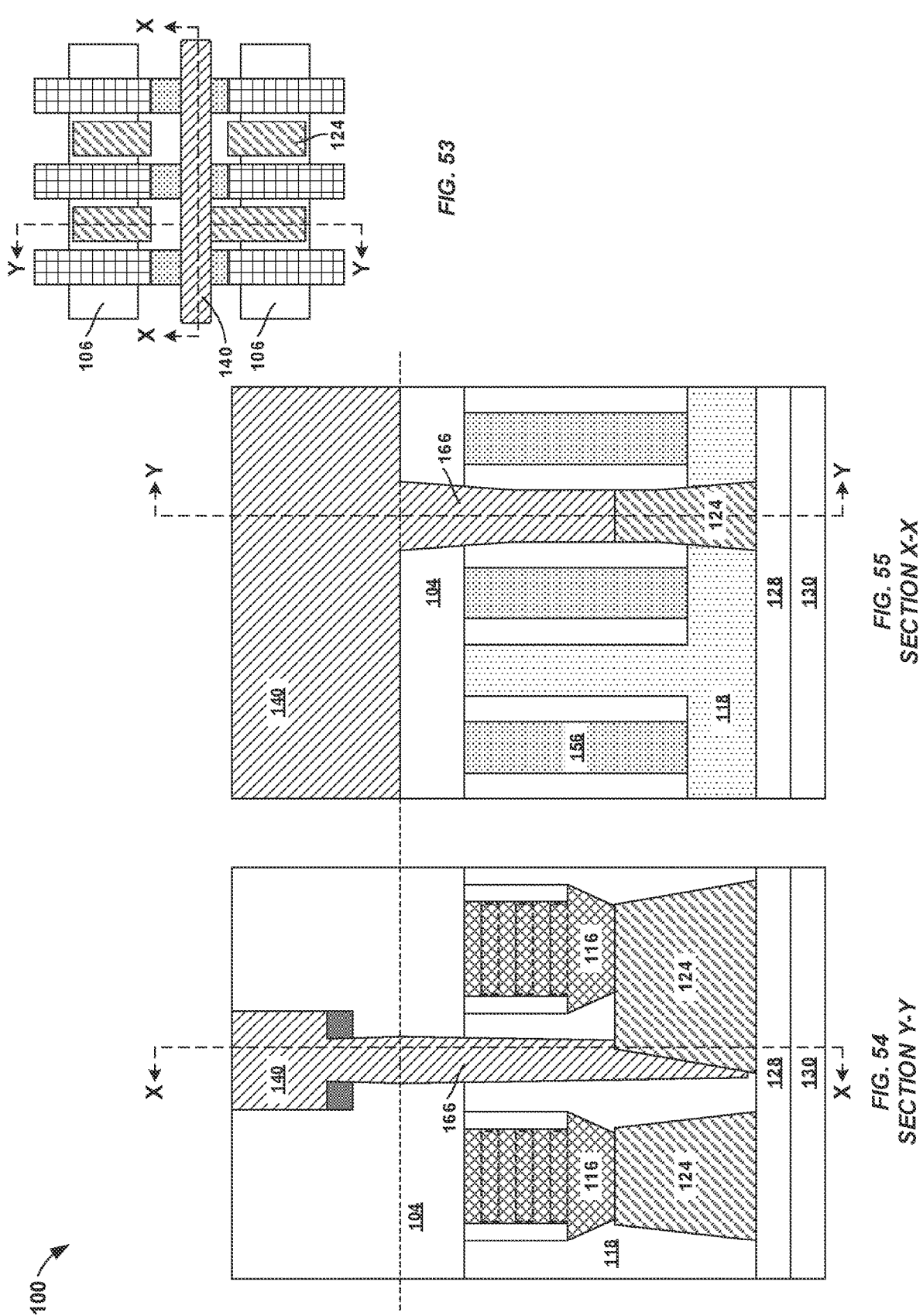
FIGS. 53, 54, and 55 depict views of a semiconductor structure after forming a backside power rail and a backside power rail contact (hereinafter "VBPR contact") according to an exemplary embodiment.

Referring now to FIGS. 53, 54, and 55, the structure 500 is shown after forming a backside power rail 140 and a backside power rail contact 166 (hereinafter "VBPR contact 166") according to an embodiment of the invention. FIG. 53 is a representative illustration of a top view of the structure 500 omitting some features as described above with reference to FIG. 26. FIG. 54 depicts a cross-sectional view of the structure 500 shown in FIG. 53 taken along line Y-Y, and FIG. 55 depicts a cross-sectional view of the structure 500 shown in FIG. 53 taken along line X-X.

The backside power rail 140 and the VBPR contact 166 are formed by filling the enlarged BPR trench 158 and the VBPR trench 162 with a conductive material according to known techniques. As such, according to an embodiment, the backside power rails 140 and the VBPR contact 166 are made from the same homogeneous material. In other cases, a first material may be deposited in the VBPR trench extension 162, and a second material may be deposited in the enlarged BPR trench 158. Additionally, the backside power rails 140, the VBPR contact 166, and the middle-of-line-contacts 124 may be made from the same conductive materials or different conductive materials depending on desired device characteristics.

In an embodiment, the backside power rail 140 and the VBPR contact 166 may include any suitable conductive material, such as, for example, ruthenium, tungsten, cobalt, or alloys thereof. After filling, excess conductive material can be polished using known techniques until a topmost surface of the backside power rail 140 are flush, or substantially flush, with topmost surfaces of the buried dielectric layer 104. Finally, a backside power network (not shown) may be formed on and in electrical contact with the backside power rail 140.

In an embodiment, the edge spacer 160 may be removed prior to filling with the chosen conductive material. Doing so would increase the overall size of the backside power rail 140.

As illustrated in FIGS. 53, 54, and 55, the semiconductor structure represented by the structure 500 has some distinctive notable features. As described herein, the VBPR contact 166, alternatively contact via, is first positioned and located using a sacrificial material during frontside processing, and subsequently formed from a conductive material during backside processing. Doing so has particular advantages and produces unique contact profiles.

First, unlike VBPR contacts fabricated solely from either the frontside or backside, sidewalls of the VBPR contact 166 are not planar, but instead have both a positive taper and a negative taper. Second, the VBPR contact 166 is sufficiently wide at the backside power rail 140 to maintain optimal power transmission and low resistance, while at the same time sufficiently narrow at the middle-of-line contact 124 to minimize, or reduce, the risk of tip-to-tip shorting. Doing so is only possible using embodiments of the present invention.

As such, an upper portion of the VBPR contact 166 will have a negative tapered profile in which a lateral width at a bottom is greater than a lateral width at the top, as illustrated. In contrast, a lower portion of the VBPR contact 166 will have a positive tapered profile in which a lateral width at a bottom is less than a lateral width at the top, also as illustrated. The tapered profiles are a direct result of whether the contact via is fabricated during frontside processing or backside processing, as will be appreciated by persons having skill in the art.

What is claimed is:

1. A semiconductor structure comprising:
a middle-of-line contact;
a backside power rail; and
a contact via extending from the middle-of-line contact to the backside power rail, wherein the contact via comprises a first portion having a negative tapered profile and a second portion having a positive tapered profile, wherein a sidewall of the contact via directly contacts a source drain epitaxy.

2. The semiconductor structure according to claim 1, wherein an interface between the first portion of the contact via and the second portion of the contact via is located within a buried dielectric layer which separates a source drain epitaxy from the backside power rail.

3. The semiconductor structure according to claim 1, wherein the contact via extends from a bottom surface of the backside power rail to a top surface of the middle-of-line contact.

4. The semiconductor structure according to claim 1, wherein a negative tapered profile indicates a lateral width at a bottom is greater than a lateral width at a top, and a positive tapered profile indicates a lateral width at a bottom is less than a lateral width at a top.

5. The semiconductor structure according to claim 1, wherein the backside power rail is above the middle-of-line contact.

6. A semiconductor structure comprising:
a middle-of-line contact;
a backside power rail; and
a contact via extending between the middle-of-line contact and the backside power rail, wherein an upper portion of the contact via comprises a positive tapered profile, and wherein a lower portion of the contact via comprises a negative tapered profile, wherein a sidewall of the contact via directly contacts a source drain epitaxy.

7. The semiconductor structure according to claim 6, further comprising:
an etch stop layer situated between a buried dielectric layer and a backside power rail dielectric layer.

8. The semiconductor structure according to claim 6, wherein an interface between the upper portion and the lower portion is located within a buried dielectric layer which separates a source drain epitaxy from the backside power rail.

9. The semiconductor structure according to claim 6, wherein the contact via extends from a bottom surface of the backside power rail to a top surface of the middle-of-line contact.

10. The semiconductor structure according to claim 6, wherein a negative tapered profile comprises a lateral width at a bottom is greater than a lateral width at a top, and a positive tapered profile comprises a lateral width at a bottom is less than a lateral width at a top.

11. The semiconductor structure according to claim 6, wherein the backside power rail is above the middle-of-line contact.

12. A semiconductor structure comprising:
a middle-of-line contact;
a backside power rail; and
a contact via extending between the middle-of-line contact and the backside power rail, wherein an upper portion of the contact via comprises a negative tapered profile, and wherein a lower portion of the contact via comprises a positive tapered profile, wherein a sidewall of the contact via directly contacts gate spacers.

13. The semiconductor structure according to claim 12, further comprising:
an edge spacer situated immediately below the backside power rail and surrounding the upper portion of the contact via.

14. The semiconductor structure according to claim 12, wherein an interface between the upper portion and the lower portion is located within a buried dielectric layer which separates a source drain epitaxy from the backside power rail.

15. The semiconductor structure according to claim 12, wherein the contact via extends from a bottom surface of the backside power rail to a top surface of the middle-of-line contact.

16. The semiconductor structure according to claim 12, wherein a negative tapered profile comprises a lateral width at a bottom is greater than a lateral width at a top, and a positive tapered profile comprises a lateral width at a bottom is less than a lateral width at a top.

17. The semiconductor structure according to claim 12, wherein the backside power rail is above the middle-of-line contact.

* * * * *